(12) United States Patent
Huang

(10) Patent No.: US 11,073,648 B2
(45) Date of Patent: Jul. 27, 2021

(54) LIGHT GUIDE ELEMENT AND ELECTRONIC DEVICE HAVING THE SAME

(71) Applicant: G. SKILL International Enterprise Co., Ltd., Taipei (TW)

(72) Inventor: Chiung-Huang Huang, Taipei (TW)

(73) Assignee: G. SKILL INTERNATIONAL ENTERPRISE CO., LTD., Taipei (TW)

( * ) Notice: Subject to any disclaimer, the term of this patent is extended or adjusted under 35 U.S.C. 154(b) by 0 days.

(21) Appl. No.: 16/428,522

(22) Filed: May 31, 2019

(65) Prior Publication Data
US 2019/0377118 A1 Dec. 12, 2019

Related U.S. Application Data

(60) Provisional application No. 62/682,223, filed on Jun. 8, 2018.

(30) Foreign Application Priority Data

Feb. 1, 2019 (TW) .................................. 108201788

(51) Int. Cl.
*F21V 8/00* (2006.01)
*F21V 33/00* (2006.01)
*G06F 1/16* (2006.01)
*G11C 5/04* (2006.01)
(Continued)

(52) U.S. Cl.
CPC .......... *G02B 6/001* (2013.01); *F21V 33/0096* (2013.01); *G02B 6/0036* (2013.01);
(Continued)

(58) Field of Classification Search
CPC .... G02B 6/001; G02B 6/0036; G02B 6/0038; G02B 6/0053; G02B 6/0043; G06F 1/1601; G06F 3/0202; G06F 3/03543; F21Y 2115/10; H05K 5/0243; H05K 5/0247; H05K 1/0247; H05K 2201/10106; H05K 2201/10113; H05K 2201/10159; G11C 5/04; G02F 1/133603; G02F 1/133607; F21V 33/00; F21V 5/005
See application file for complete search history.

(56) References Cited

U.S. PATENT DOCUMENTS 8,909,009 B2 * 12/2014 Lee ...................... G02B 6/0036
385/31
10,429,568 B2 * 10/2019 Cheng ..................... G11C 5/04
(Continued)

*Primary Examiner* — Erin Kryukova
(74) *Attorney, Agent, or Firm* — Hamre, Schumann, Mueller & Larson, P.C.

(57) ABSTRACT

A light guide element is adapted to be used in an electronic device including a light emitting unit that has at least one light emitting element. The light guide element includes a base portion and a plurality of light guide bodies. The base portion includes a light entry surface for incidence of light emitted by the light emitting unit and at least one side surface connected to the light entry surface. The light guide bodies are disposed on the at least one side surface. Each of the light guide bodies is formed with at least three light exit surfaces. Each of the light exit surfaces has an extension direction. The extension direction and the at least one side surface of the base portion form therebetween an angle being between 10° and 85°.

26 Claims, 24 Drawing Sheets

(51) Int. Cl.
  *F21Y 115/10* (2016.01)
  *G06F 3/02* (2006.01)
  *G06F 3/0354* (2013.01)
  *H05K 5/02* (2006.01)
  *F21V 29/60* (2015.01)
  *F21V 29/56* (2015.01)
  *F21V 5/00* (2018.01)

(52) U.S. Cl.
  CPC .............. *G06F 1/1601* (2013.01); *G11C 5/04* (2013.01); *F21V 5/005* (2013.01); *F21V 29/56* (2015.01); *F21V 29/60* (2015.01); *F21V 33/0056* (2013.01); *F21Y 2115/10* (2016.08); *G06F 3/0202* (2013.01); *G06F 3/03543* (2013.01); *H01H 2219/062* (2013.01); *H05K 5/0243* (2013.01)

(56) References Cited

U.S. PATENT DOCUMENTS

| | | | |
|---|---|---|---|
| 2011/0243500 A1* | 10/2011 | Lee | G02B 6/0036 |
| | | | 385/31 |
| 2015/0285484 A1* | 10/2015 | Hsu | G02B 6/0001 |
| | | | 362/607 |
| 2016/0334559 A1* | 11/2016 | Kuo | G02B 6/00 |
| 2017/0142827 A1* | 5/2017 | Cheng | H05K 1/0274 |
| 2017/0343198 A1* | 11/2017 | Ning | G11C 11/40626 |
| 2018/0024285 A1* | 1/2018 | Tseng | G02B 6/0016 |
| | | | 362/23.1 |
| 2018/0164496 A1* | 6/2018 | Cheng | G02B 6/0001 |
| 2019/0146139 A1* | 5/2019 | Joo | G02B 6/0065 |
| | | | 362/613 |
| 2019/0346614 A1* | 11/2019 | Joo | G02B 6/0051 |

* cited by examiner

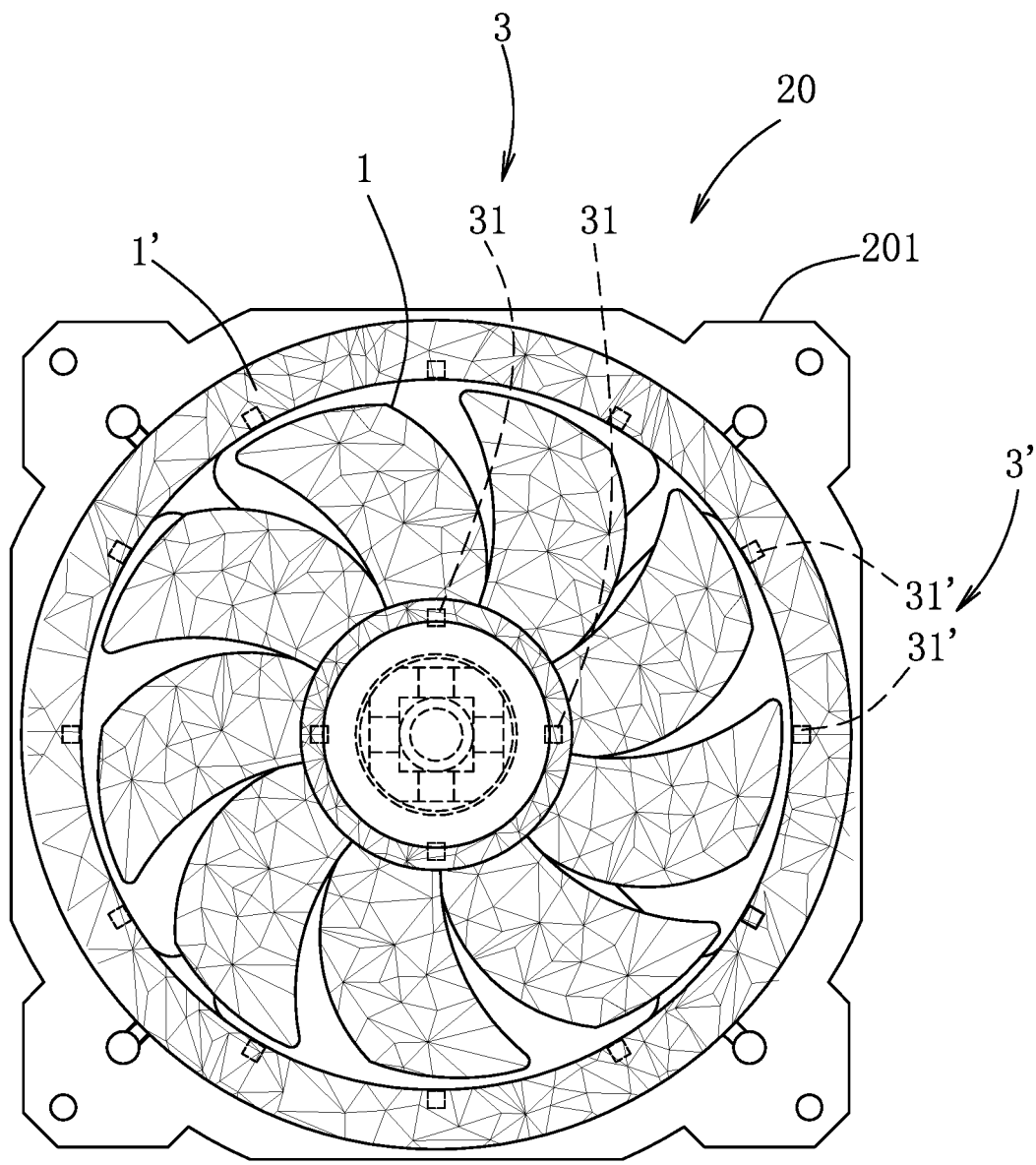
F I G. 11

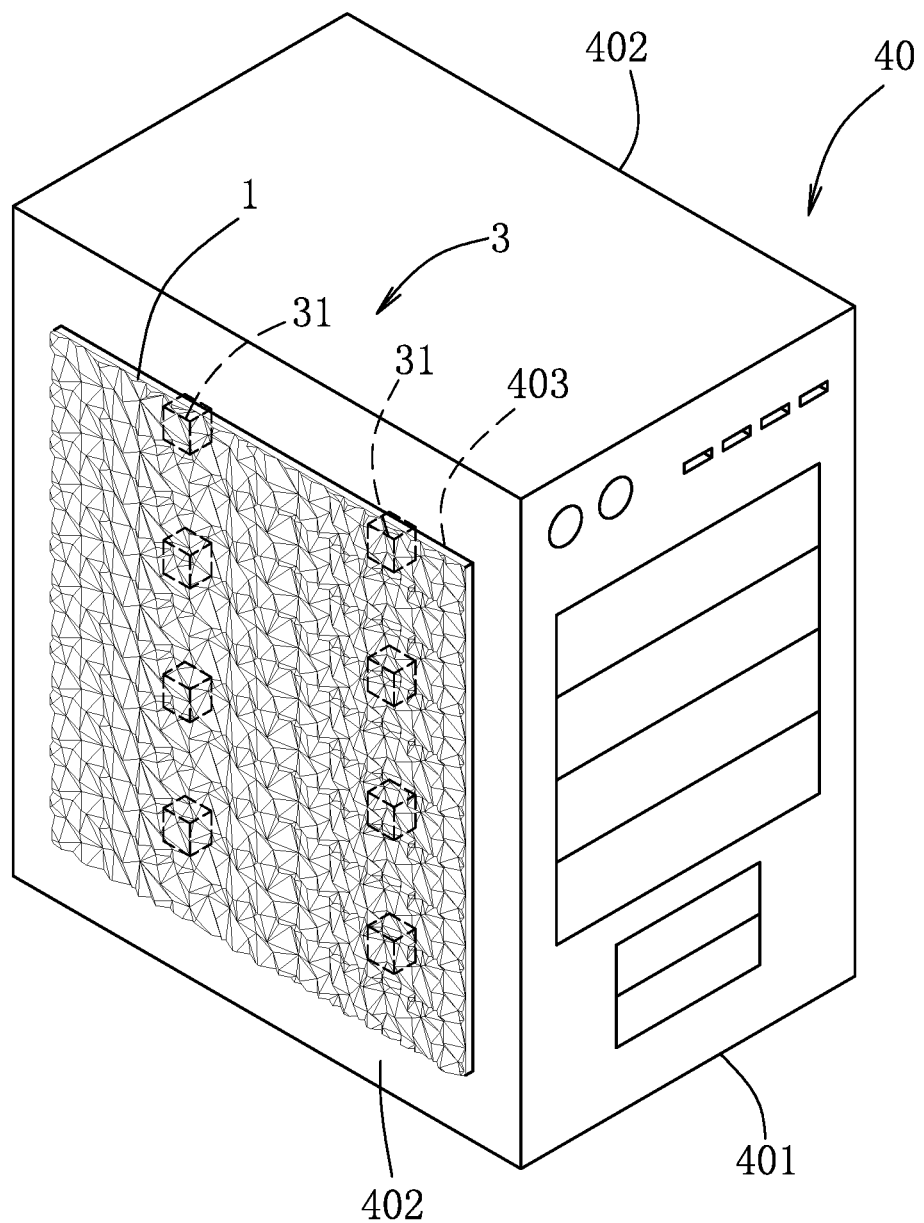
F I G. 16

LIGHT GUIDE ELEMENT AND ELECTRONIC DEVICE HAVING THE SAME

CROSS-REFERENCE TO RELATED APPLICATIONS

This application claims priority to U.S. Provisional Patent Application No. 62/682,223, filed on Jun. 8, 2018, and Taiwanese Utility Model Patent Application No. 108201788, filed on Feb. 1, 2019.

FIELD

The disclosure relates to a light guide element, more particularly to a light guide element including a plurality of light guide bodies formed with multiple light exit surfaces, and to an electronic device including the light guide element.

BACKGROUND

A conventional electronic device such as a memory device often includes light emitting elements (such as light emitting diodes) covered with light guide elements. Light emitted by the light emitting elements will be projected outwards by the light guide elements for achieving lighting and visual effects.

However, when the light guide elements are made of a transparent material, the light emitted by the light emitting elements tends to straightly pass through the light guide elements. In a projection area in positional correspondence with the light emitting elements, the intensity of the light perceived by a user who views the electronic device is relatively high, which may cause discomfort to the user. Thus, the light guide elements of the conventional electronic devices generally have particles of a light diffusion agent dispersed therein so as to refract and diffuse the light from the light emitting element. However, multiple refraction of the light softens the light perceived by the user and creates a haze effect, which reduces the projection distance and area of the light emitting elements.

SUMMARY

Therefore, the object of the disclosure is to provide a light guide element that can alleviate at least one of the drawbacks of the prior art. An electronic device including the light guide element is also provided.

According to one aspect of the disclosure, a light guide element is adapted to be used in an electronic device including a light emitting unit that has at least one light emitting element. The light guide element includes a base portion and a plurality of light guide bodies.

The base portion is configured to be disposed corresponding in position to a light emitting surface of the light emitting unit, and includes a light entry surface for incidence of light emitted by the light emitting unit and at least one side surface connected to the light entry surface.

The light guide bodies are disposed on the at least one side surface of the base portion. Each of the light guide bodies is formed with at least three light exit surfaces. Each of the light exit surfaces of the light guide bodies has an extension direction. The extension direction and the at least one side surface of the base portion form an angle therebetween, the angle being between 10° and 85°.

According to another aspect of the disclosure, an electronic device includes a main body, at least one light emitting unit, and a light guide unit.

The at least one light emitting unit is disposed on the main body, and has a light emitting surface, and includes at least one light emitting element.

The light guide unit includes the first light guide element configured as the above light guide element. The light guide unit is disposed on the main body and in positional correspondence with the light emitting surface of the at least one light emitting unit.

BRIEF DESCRIPTION OF THE DRAWINGS

Other features and advantages of the disclosure will become apparent in the following detailed description of the embodiments with reference to the accompanying drawings, of which:

FIG. 11 is a front view of a second embodiment of an electronic device according to the disclosure, which is configured as a fan;

FIG. 16 is a perspective view of a fourth embodiment of an electronic device configured as a desktop computer;

DETAILED DESCRIPTION

Figure 1:
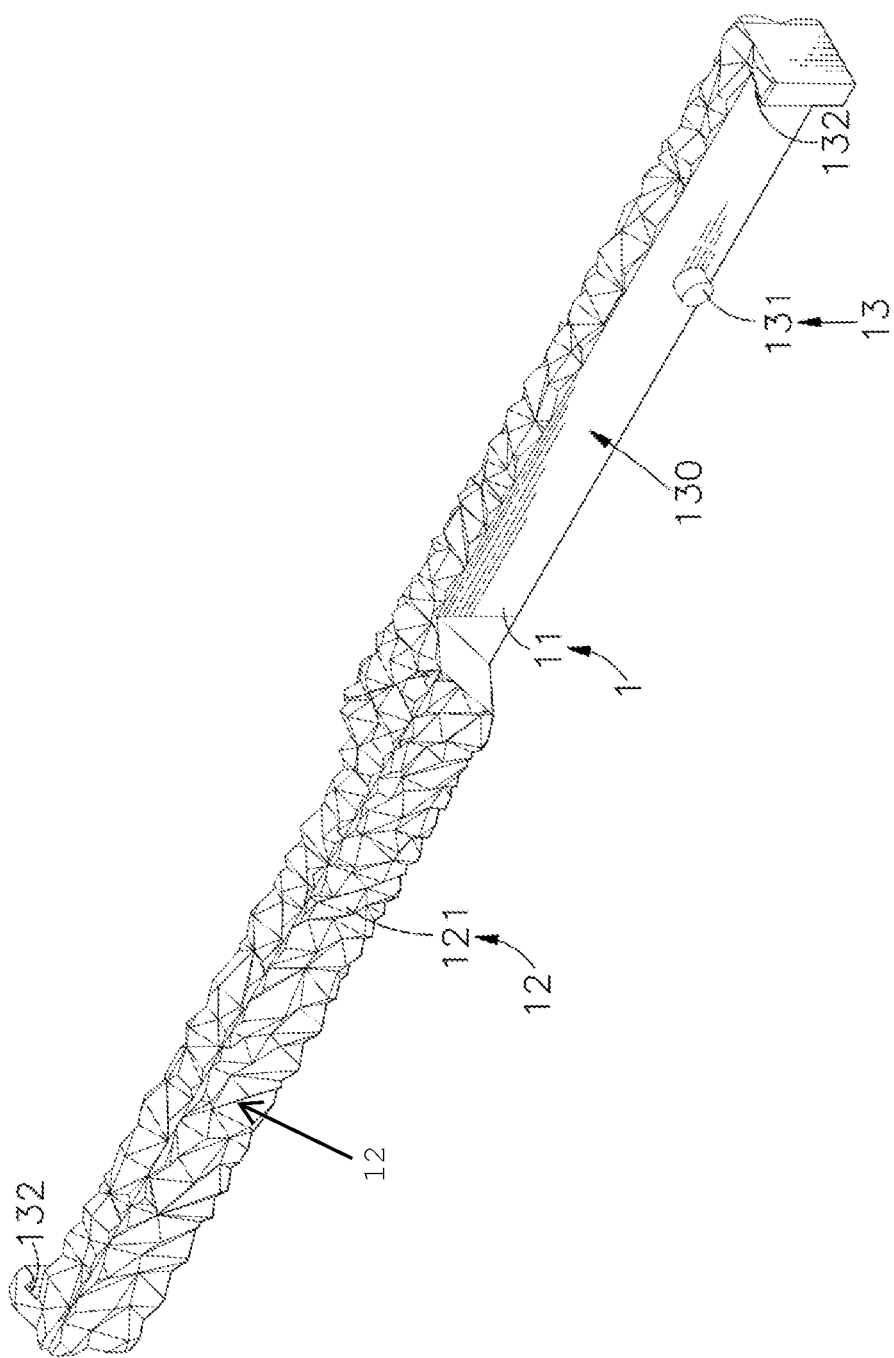
FIG. 1 is a perspective view of an embodiment of a light guide element according to the disclosure.
Figure 2:
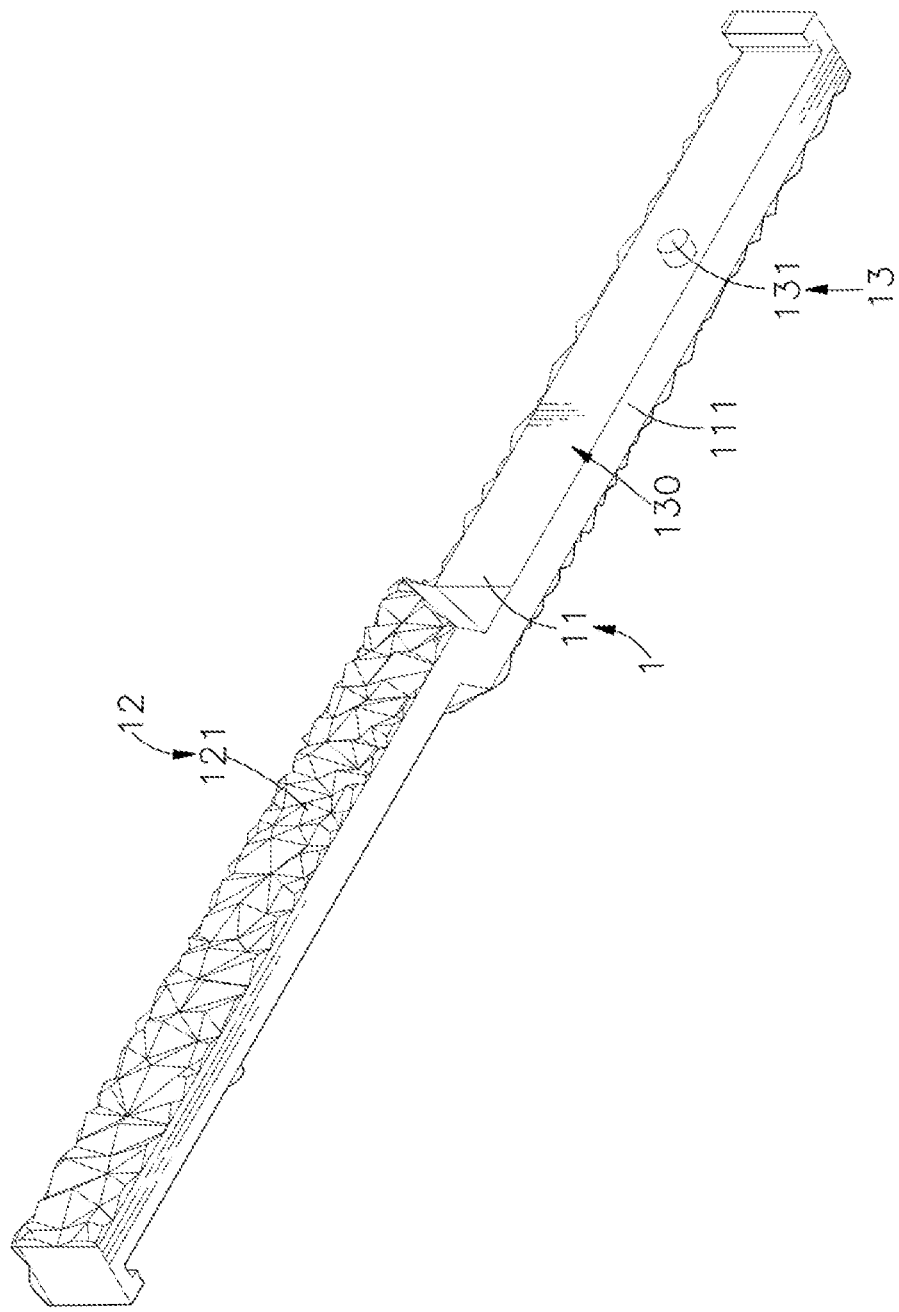
FIG. 2 is another perspective view of the light guide element.
Figure 3:
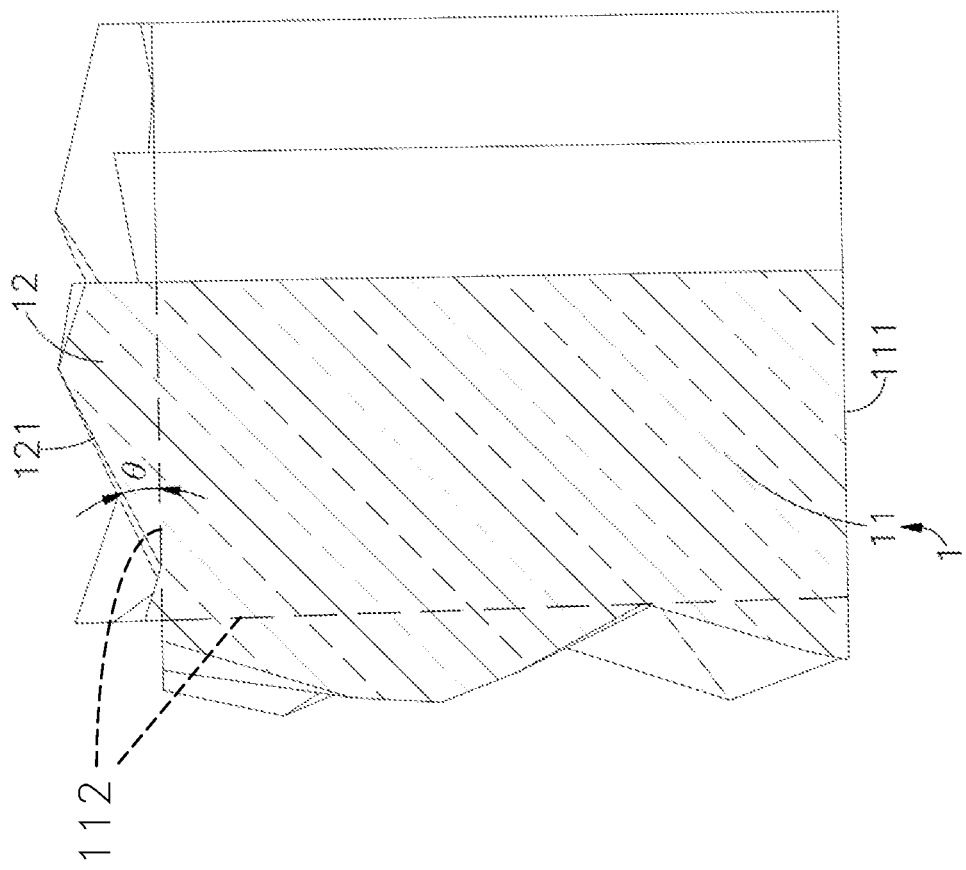
FIG. 3 is a sectional view of the light guide element.
Figure 4:
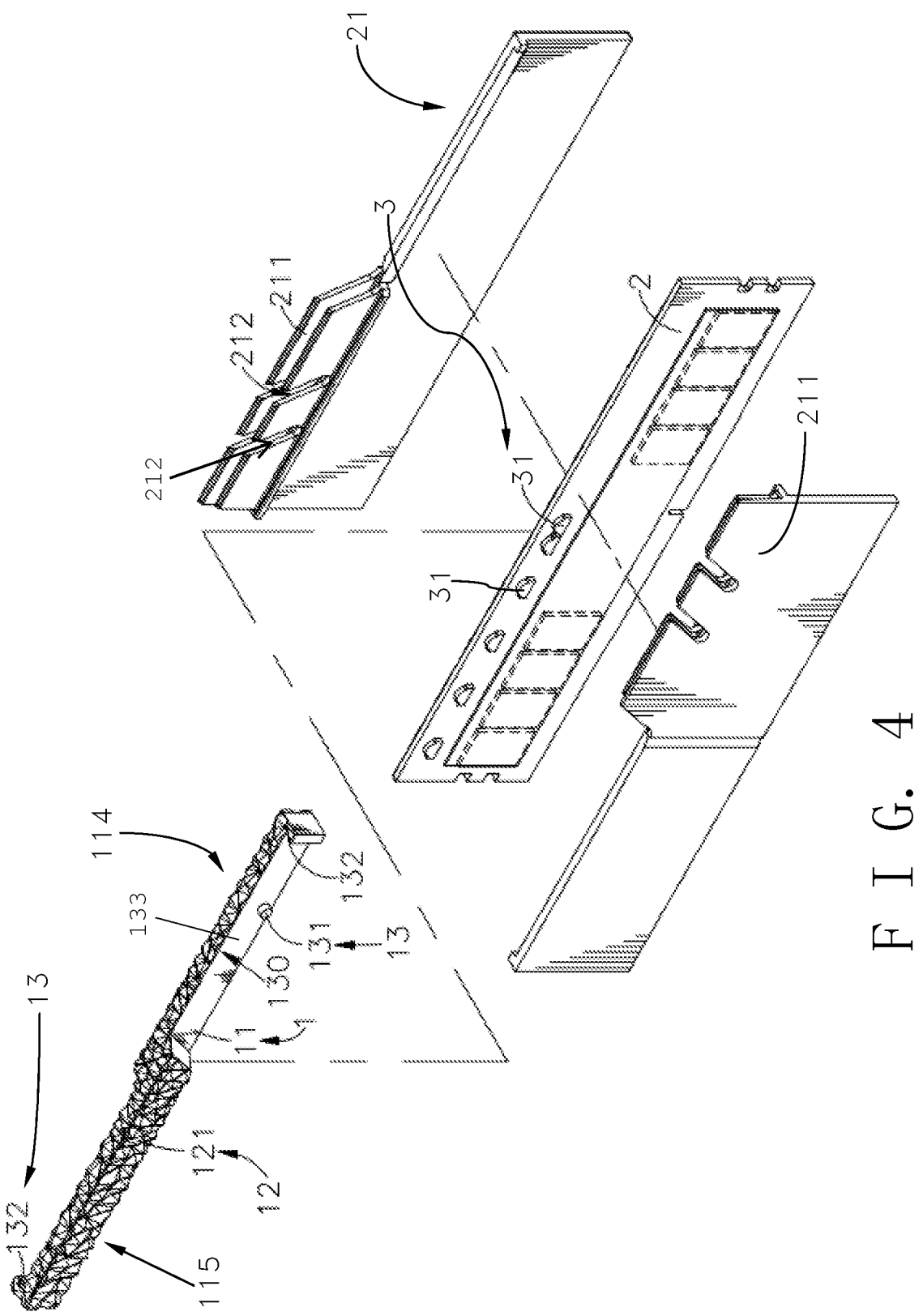
FIG. 4 is an exploded perspective view of a first embodiment of an electronic device according to the disclosure, which is configured as a memory.

Before the present invention is described in greater detail, it should be noted that where considered appropriate, reference numerals or terminal portions of reference numerals have been repeated among the figures to indicate corresponding or analogous elements, which may optionally have similar characteristics.

Referring to FIGS. 1 to 4, a light guide element 1 is adapted to be used in an electronic device including a light emitting unit 3 that has at least one light emitting element 31.

The light guide element includes a base portion 11 and a plurality of light guide bodies 12. The light guide element 1 may be made of a light-transmissible material that does not include a light diffusion agent, but is not limited in this respect.

The base portion 11 is configured to be disposed corresponding in position to a light emitting surface of the light emitting unit 3. The base portion 11 includes a light entry surface 111 for incidence of light emitted by the light emitting unit 3, and at least one side surface 112 connected to the light entry surface 111. The light entry surface 111 is substantially flat.

The light guide bodies 12 are disposed on the at least one side surface 112 of the base portion 11. In one form, the light guide bodies 12 form a continuous irregular shape. The light guide bodies 12 may have a distribution density not less than two of the light guide bodies 12 per sixteen-centimeter square area of the at least one side surface 112 of the base portion 11. Each of the light guide bodies 12 is formed with at least three light exit surfaces 121. Each of the light exit surfaces 121 of the light guide bodies 12 has an extension direction. The extension direction and the at least one side surface of the base portion 11 form an angle (θ) therebetween, and the angle (θ) is between 10° and 85°. In this embodiment, the angle (θ) is between 25° and 65°. The light exit surfaces 121 are at least partially disposed in positional correspondence with the light emitting surface of the light emitting unit 3.

The light guide bodies 12 may have a height ranging from 0.5 mm to 5 mm. In one form, the height of the light guide bodies ranges from 0.8 mm to 1.2 mm. In certain embodiments, the light guide bodies 12 disposed on two opposite sides of the at least one side surface 112 of the base portion 11 have a height greater than that of the light guide bodies 12 disposed between the two opposite sides of the at least one side surface 112, and the light guide bodies 12 disposed between the two opposite sides of the at least one side surface 112 have an uneven height distribution. In one form, the light guide bodies 12 disposed between the two opposite sides of the at least one side surface 112 may alternate in height between 0.8 mm and 1 mm, and the light guide bodies 12 disposed on two opposite sides of the at least one side surface 112 of the base portion 11 have a height of 1 mm. The light guide bodies 12 with the height of 0.8 mm allow the light to be transmitted to the light guide bodies 12 with the height of 1 mm.

Each of the light guide bodies 12 may be a polyhedron, such as a triangular pyramid, quadrilateral pyramid, pentagonal pyramid, hexagonal pyramid, heptagonal pyramid, octagonal pyramid, other irregular shapes, etc.

Figure 6:
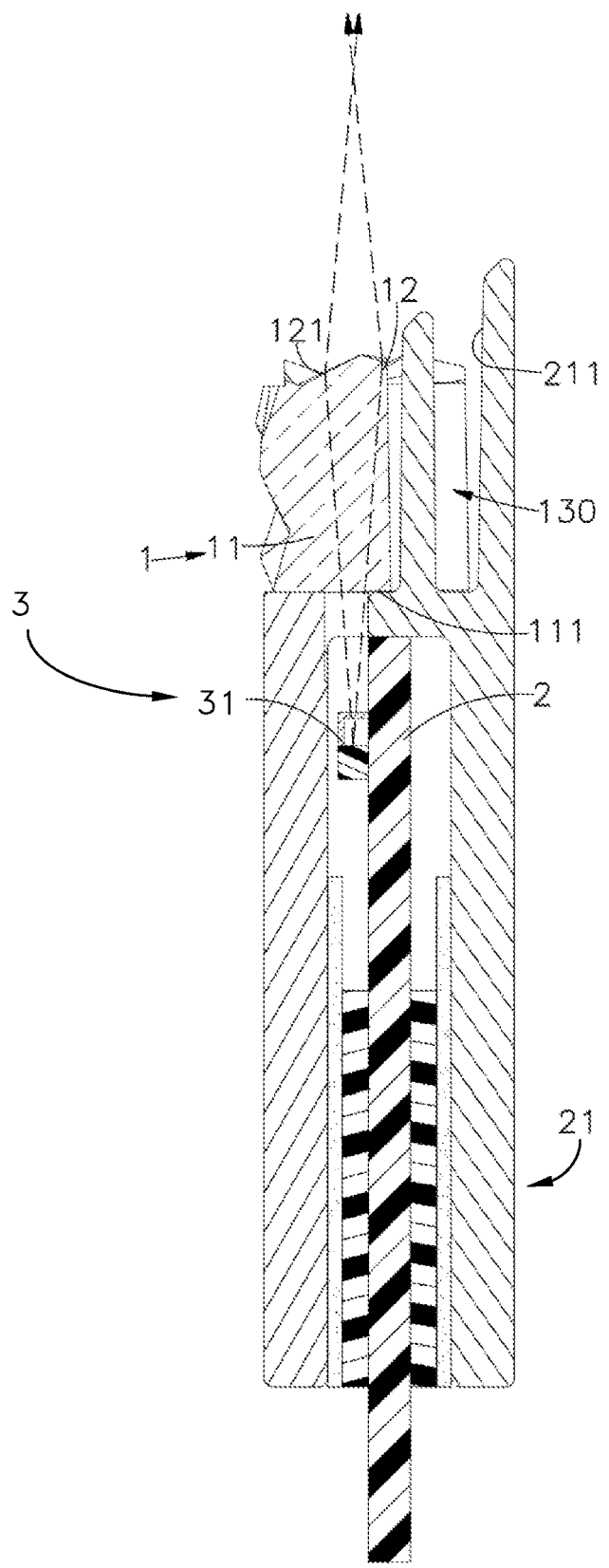
FIG. 6 is a schematic view illustrating light emitted by a light emitting element of the electronic device of FIG. 4.

Referring to FIG. 6, when the light emitting members 31 emit light, light rays enter the light guide element 1 through the light entry surface 111 and transmit through the base portion 11 to the light guide bodies 12. The light guide bodies 12 refract the light rays such that the light rays exit unevenly from the light exit surfaces 121 and converge near points directly above edges of the light exit surfaces 121, which increases the distance the light rays may project.

The benefits of the embodiment are as follows:

1) The light guide bodies 12 of the light guide element 1 refracts the light emitted by the light emitting elements 31 to guide the light to transmit throughout the light guide element 1, improving consistency of brightness of the light guide element 1 and preventing a user from experiencing discomfort due to seeing the light directly emitted by the light emitting elements 31. Additionally, the uneven continuous shape formed the light exit surfaces 121 allows uneven refraction of the light, producing regionally an optical glare effect that adds to the aesthetic quality of the electronic device that includes the light guide element 1.

2) Because the light rays are diffused due to the irregular continuous shape of the light guide bodies 12, a light diffusion agent does not need to be added to the light guide element 1, and the quantity of the light emitting elements 31 needed is reduced, both of which reduce cost. Without the use of the light diffusion agent, a haze effect is not produced, which improves the brightness, projection distance, and projection area the light guide element 1.

Figure 8:
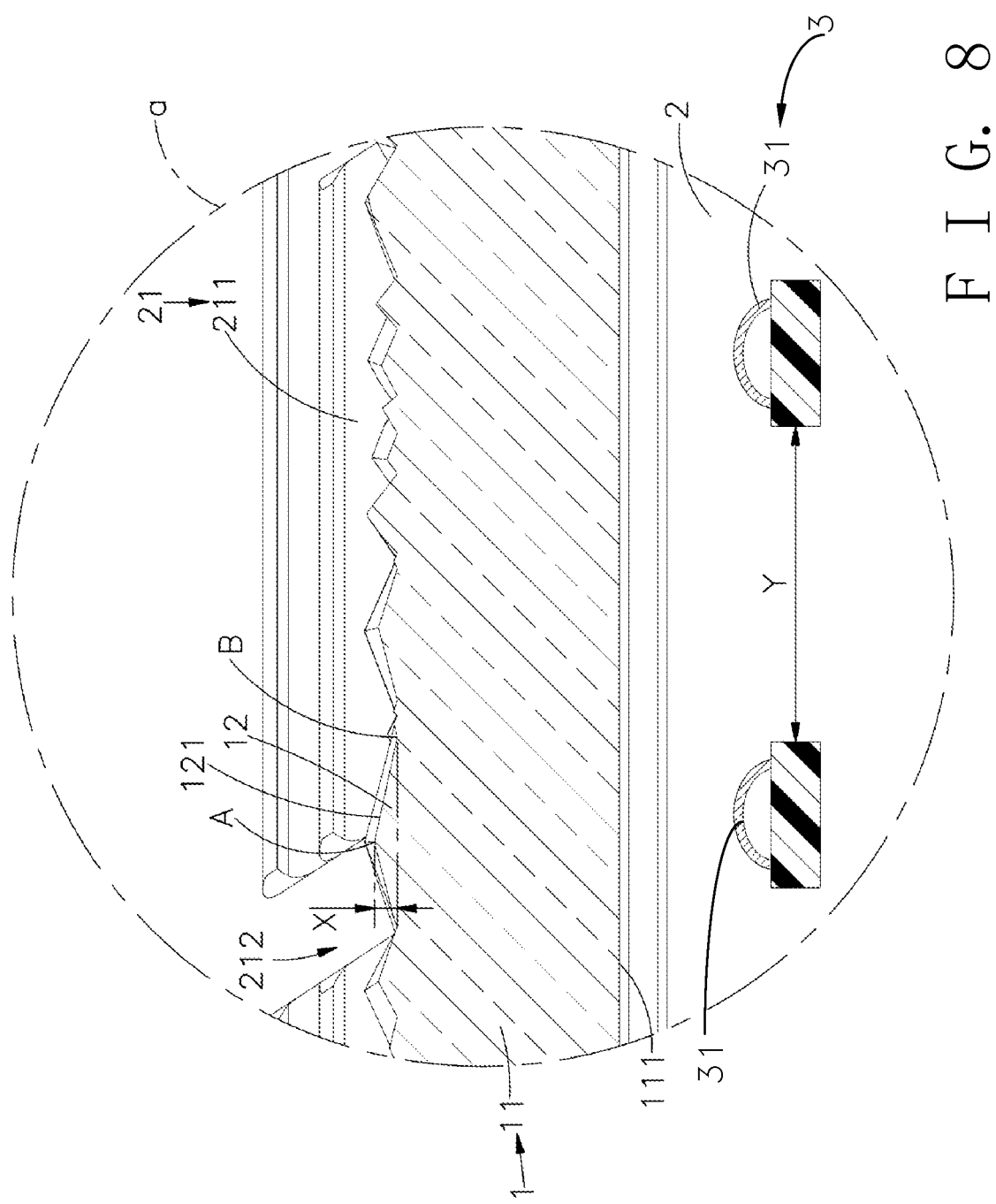
FIG. 8 is a partially magnified view of FIG. 7.
Figure 9:
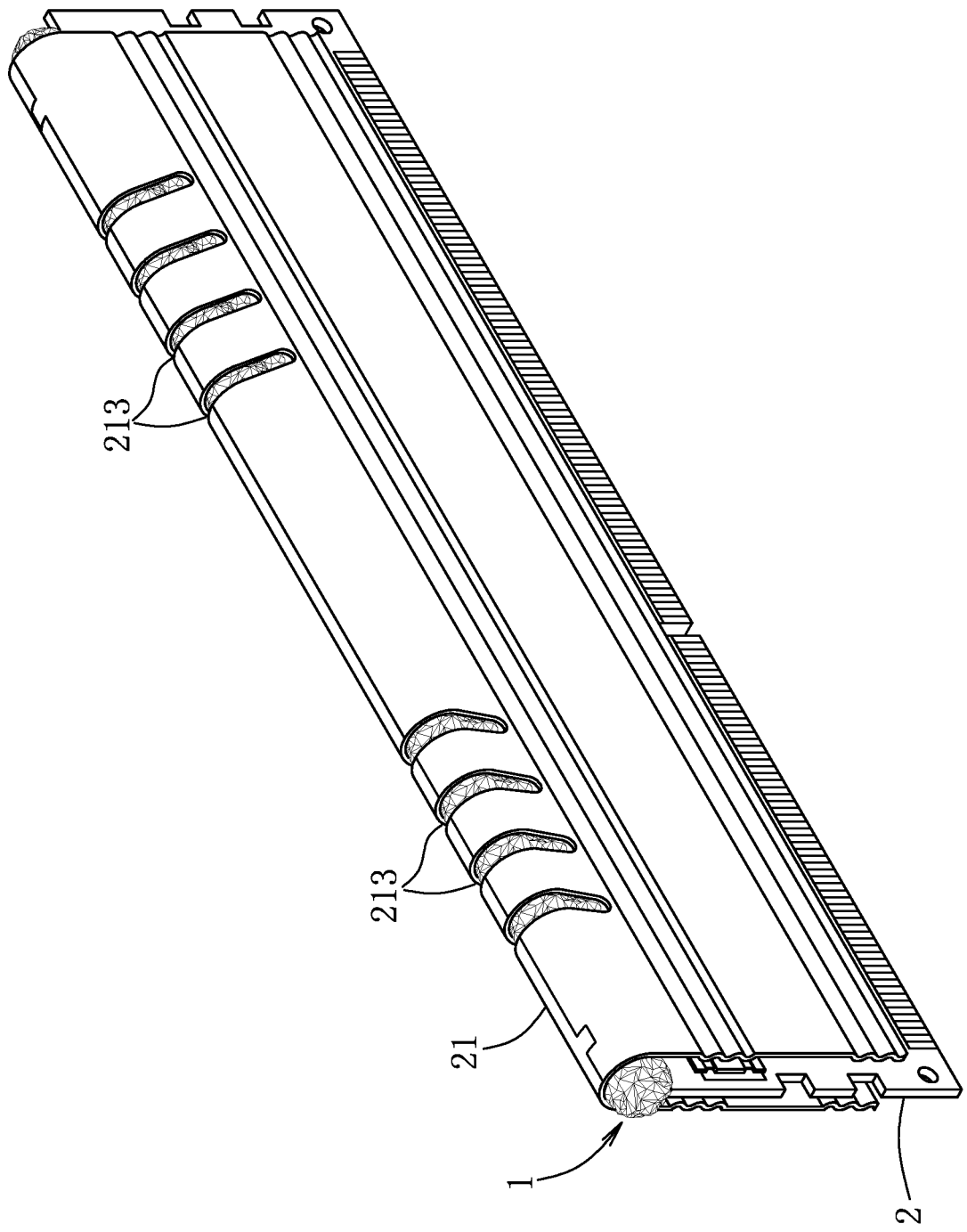
FIG. 9 is a perspective view of a variation of the first embodiment of the electronic device.
Figure 10:
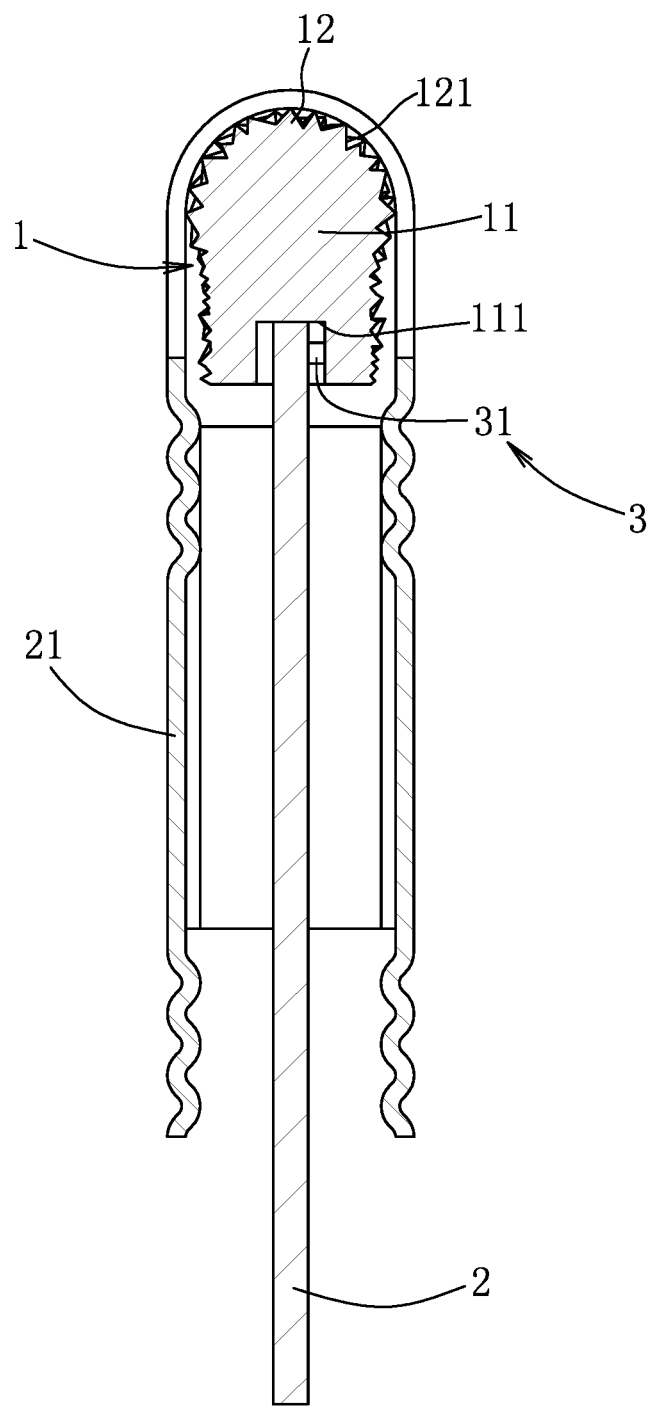
FIG. 10 is a sectional view of the variation of FIG. 9.

3) By disposing the light exiting surfaces 121 positionally corresponding to the light emitting elements 31, light emitted by the light emitting elements 31 are prevented from reaching the junctions between the light exiting surfaces 121 (e.g. point (A), where the light would be brighter and point (B), where the light would be dimmer, in FIG. 8) which may negatively impact the refraction of the light, thus the overall brightness and evenness of brightness is improved.

4) The uneven height distribution of the light guide bodies 12 disposed between the two opposite sides of the side surface 112 allows the light to transmit across the light guide element 1, improving the even distribution of light, while the greater height of the light guide bodies 12 disposed on the two opposite sides of the side surface 112 increases the projection distance of the light.

5) The light entry surface 111 of the base portion 11 being substantially flat reduces reflection of light entering the light guide element 1, which improves the transmissivity of the light guide element 1.

6) The flat light entry surface 111 is also in favor of production of the light guide element 1, as the light guide element 1 may be removed smoothly from a mold, making the light guide element 1 more suitable for mass production.

The electronic device of the disclosure including the abovementioned light guide element 1 includes a main body, the at least one light emitting unit 3, and a light guide unit. The at least one light emitting unit 3 is disposed on the main body, and has a light emitting surface, and includes the at least one light emitting element 31. In this embodiment, the light emitting elements 31 are light emitting diodes (LED), but in practical application may be any light emitting sources such as organic light emitting diodes, incandescent bulbs, halogen lamps, etc.

The light guide unit includes a first light guide element that is the aforementioned light guide element 1. The light guide unit is disposed on the main body and in positional correspondence with the light emitting surface of the at least one light emitting unit 3. In this embodiment, the light entry surface 111 of the first light guide element 1 is proximal to but spaced-apart from the light emitting surface of the light emitting elements 31, but in practical applications may be in contact with the light emitting surface of the light emitting elements 31.

In other embodiments, the electronic device may be configured as a variety of computer components or peripherals. Referring back to FIG. 4 in combination with FIG. 5, in a first embodiment of the electronic device of the disclosure, the electronic device is configured as a memory module and further includes at least one heat dissipating unit 21, the main body is configured as a memory body 2, and the at least one heat dissipating unit 21 is mounted to the memory body 2. The first light guide element 1 is disposed on the heat dissipating unit 21.

Referring to FIG. 8, each of the light guide bodies 12 of the first light guide element 1 may have a height (X) that ranges from 0.5 mm to 5 mm, and the light emitting elements 31 are spaced apart by a distance of 15 mm. In this embodiment, the distribution density of the light guide bodies 12 is not less than two of the light guide bodies 12 per two-centimeter square area of the at least one side surface 112 of the base portion 11.

Referring back to FIGS. 1 and 4, the base portion 11 of the first light guide element 1 includes a first portion 114 and a second portion 115 extending from the first portion 114 along a non-straight line direction. The light entry surface 111 and the at least one side surface 112 extend from the first portion 114 to the second portion 115. The first light guide element 1 further includes a pair of spaced-apart securing members 13 that are respectively formed in the first and second portions 114, 115 of the base portion 11. Each of the securing members 13 is connected between the at least one side surface 112 and the light entry surface 111 of the base portion 11 and has two opposite end portions one of which is formed with a hooked portion 132, a groove-defining surface 133 extending between the two opposite end portions and defining a receiving groove 130, and at least one securing protrusion 131 protruding from the groove-defining surface and being cylindrical. The groove-defining surfaces 133 of the securing members 13 face two different directions. In this embodiment, the groove-defining surfaces 133 face opposite directions, and the first and second portions 114, 115 and the hooked portions 132 cooperatively form an S shape.

Figure 5:
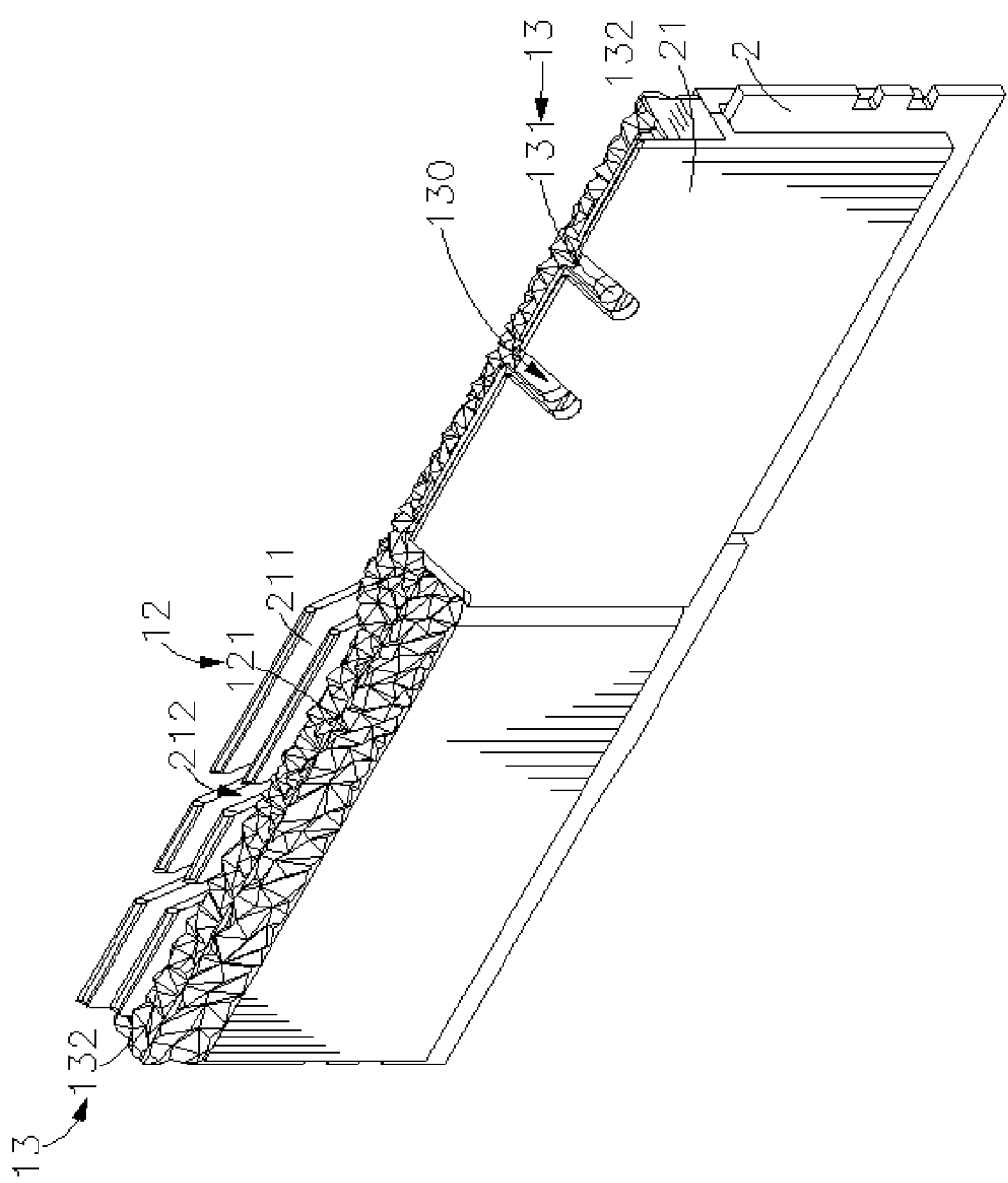
FIG. 5 is a perspective view of the electronic device of FIG. 4.
Figure 7:
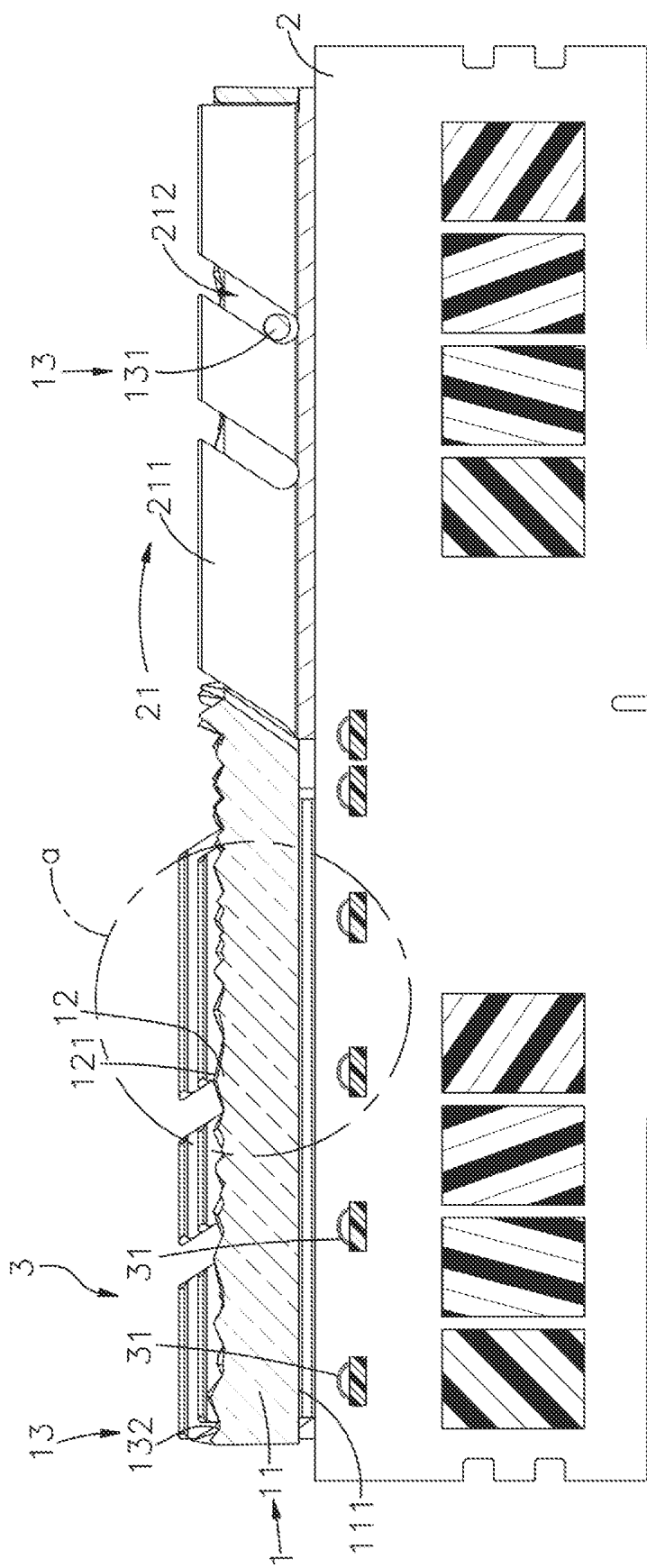
FIG. 7 is a sectional view of the electronic device of FIG. 4.

The at least one heat dissipating unit 21 includes at least one heat dissipating fin 211 formed with at least one slanting securing groove 212. In this embodiment, the heat dissipating unit 21 includes two heat dissipating fins 211 each formed with two slanting securing groove 212. Referring to FIGS. 5 to 7, the dissipating fins 211 are received in the receiving groove 130 of a corresponding one of the securing members 13, the at least one securing protrusion 131 of the corresponding securing member 13 is engaged with one of the slanting securing grooves 212 of the corresponding heat dissipating fins 211, and the hook portions 132 of the securing members 13 are respectively hooked to opposite ends of the at least one heat dissipating unit 21.

In a variation of this embodiment, the securing members 13 are omitted from the first light guide element 1, and the heat dissipating fins 211 are omitted from the heat dissipating unit 21. The heat dissipating unit 21 instead covers over the first light guide element 1 and the memory body 2, and has a plurality of windows 213 that the first light guide element 1 is exposed from.

Figure 12:
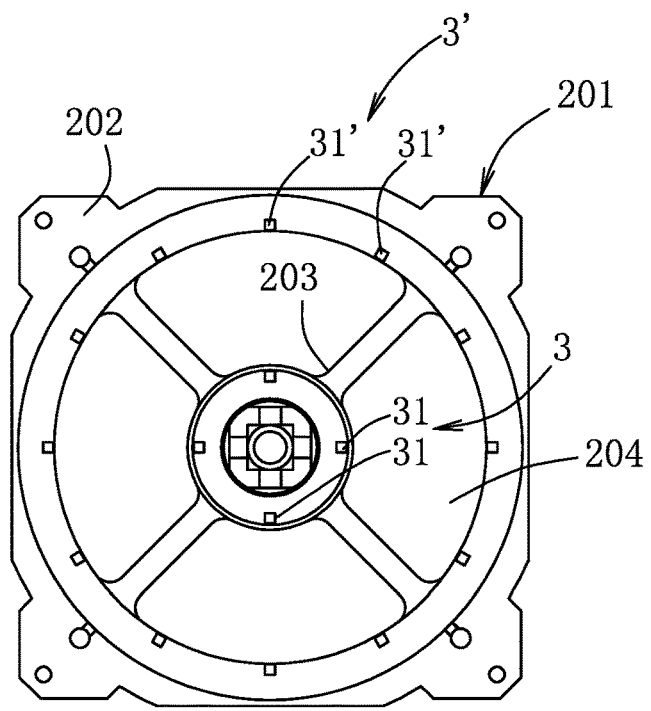
FIG. 12 is an exploded front view of the electronic device of FIG. 11.
Figure 12:
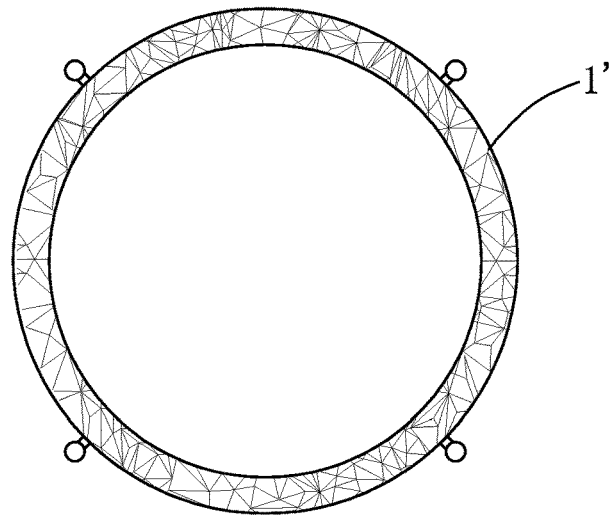
Figure 12:
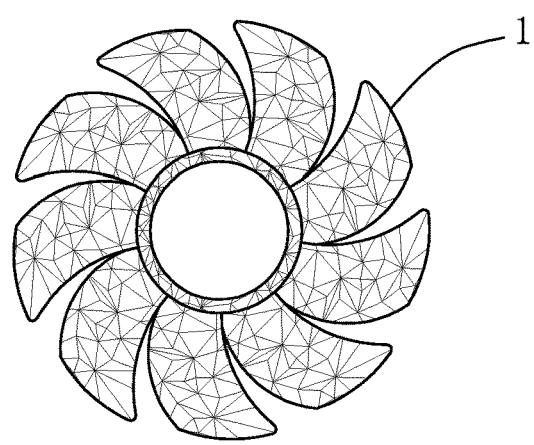
Figure 13:
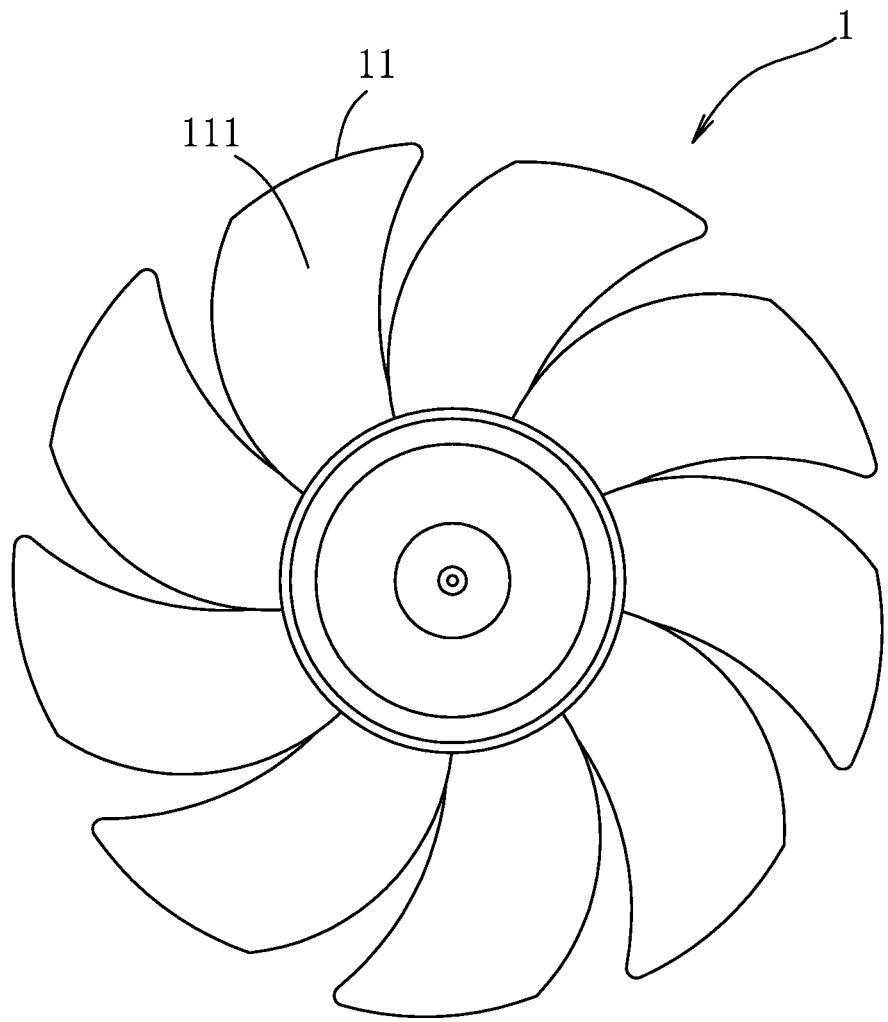
FIG. 13 is a back view of a first light guide element of the electronic device of FIG. 11.

Referring to FIGS. 11 to 13, in a second embodiment of the electronic device of the disclosure, the electronic device is configured as a fan 20 and the main body is configured as a fan base 201 formed with a recess 204.

The fan base 201 has an outer frame portion 202 and an inner frame portion 203 connected to an inner peripheral of the outer frame portion 202, the outer and inner frame portions 202, 203 cooperatively define the recess 204.

The electronic device includes two of the light emitting units 3, 3', which are annular and are disposed on the inner and outer frame portions 203, 202, respectively.

The first light guide element 1 is fan-blade shaped, rotatably mounted to the fan base 201 and received in the recess 204. The light guide unit further includes a second light guide component 1' that is ring-shaped and disposed on the outer frame portion 202. The first light guide element 1 covers one of the light emitting units 3 which is disposed on the inner frame portion 203, and the second light guide element 1' covers the other of the light emitting units 3' which is disposed on the outer frame portion 202.

Figure 14:
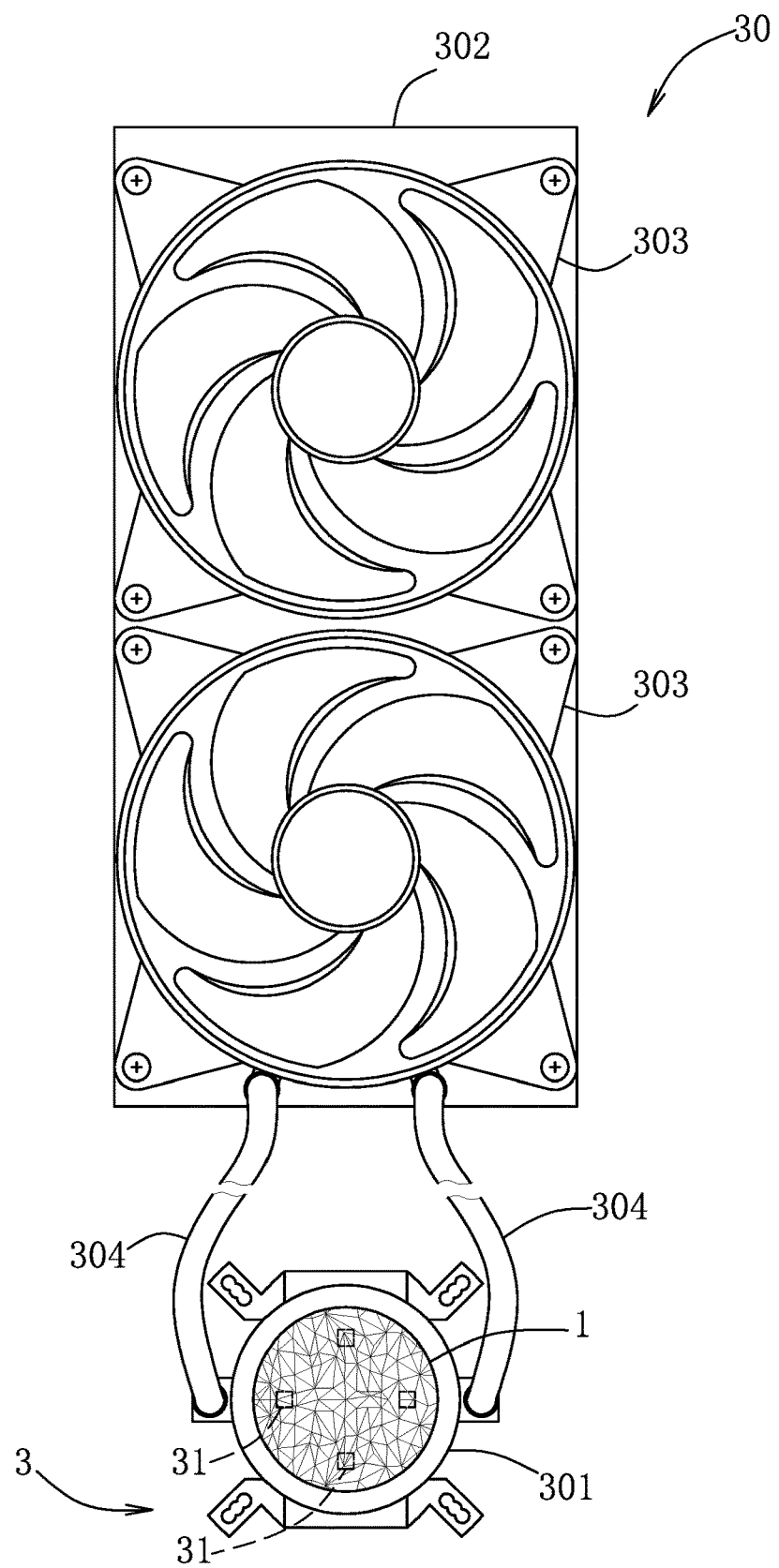
FIG. 14 is a front view of a third embodiment of an electronic device according to the disclosure, which is configured as a water cooling module.
Figure 15:
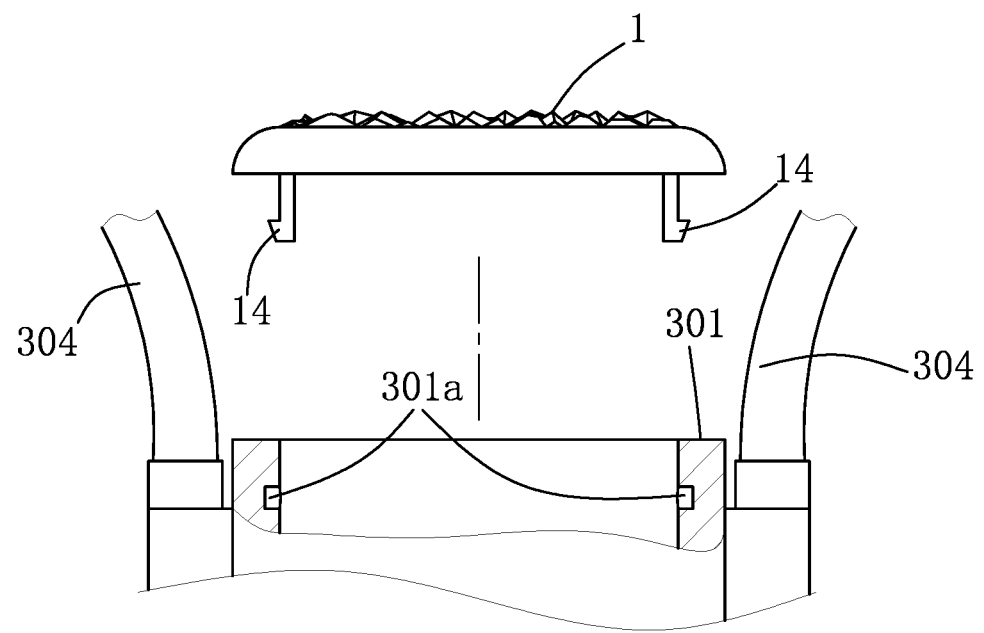
FIG. 15 is a schematic view illustrating a first light guide element and a water cooling block of the electronic device of FIG. 14.

Referring to FIGS. 14 and 15, in a third embodiment of the electronic device of the disclosure, the electronic device is configured as a water cooling module 30 adapted to be installed within a computer to help with heat dissipation, the main body is configured as a water cooling head 301, and the first light guide element 1 is mounted to the water cooling head 301 and covers the at least one light emitting unit 3. The electronic device 30 further includes two tubes 304, and a heat dissipating unit 302 including two fans 303 and input and output ports connected to the water cooling head through the tubes 304. In this embodiment, the first light guide element 1 further includes two snap-fit members 14 engaged with grooves 301a formed on an inner wall of the water cooling head 301 to mount the first light guide element 1 to the water cooling head 301.

Referring to FIG. 16, in a fourth embodiment of the electronic device of the disclosure, the electronic device is configured as a desktop computer 40, the main body is configured as a casing 401 including two side walls 402, one of which is formed with an opening 403, and the first light guide element 1 is disposed on the casing 401 and covers the opening 403.

Figure 17:
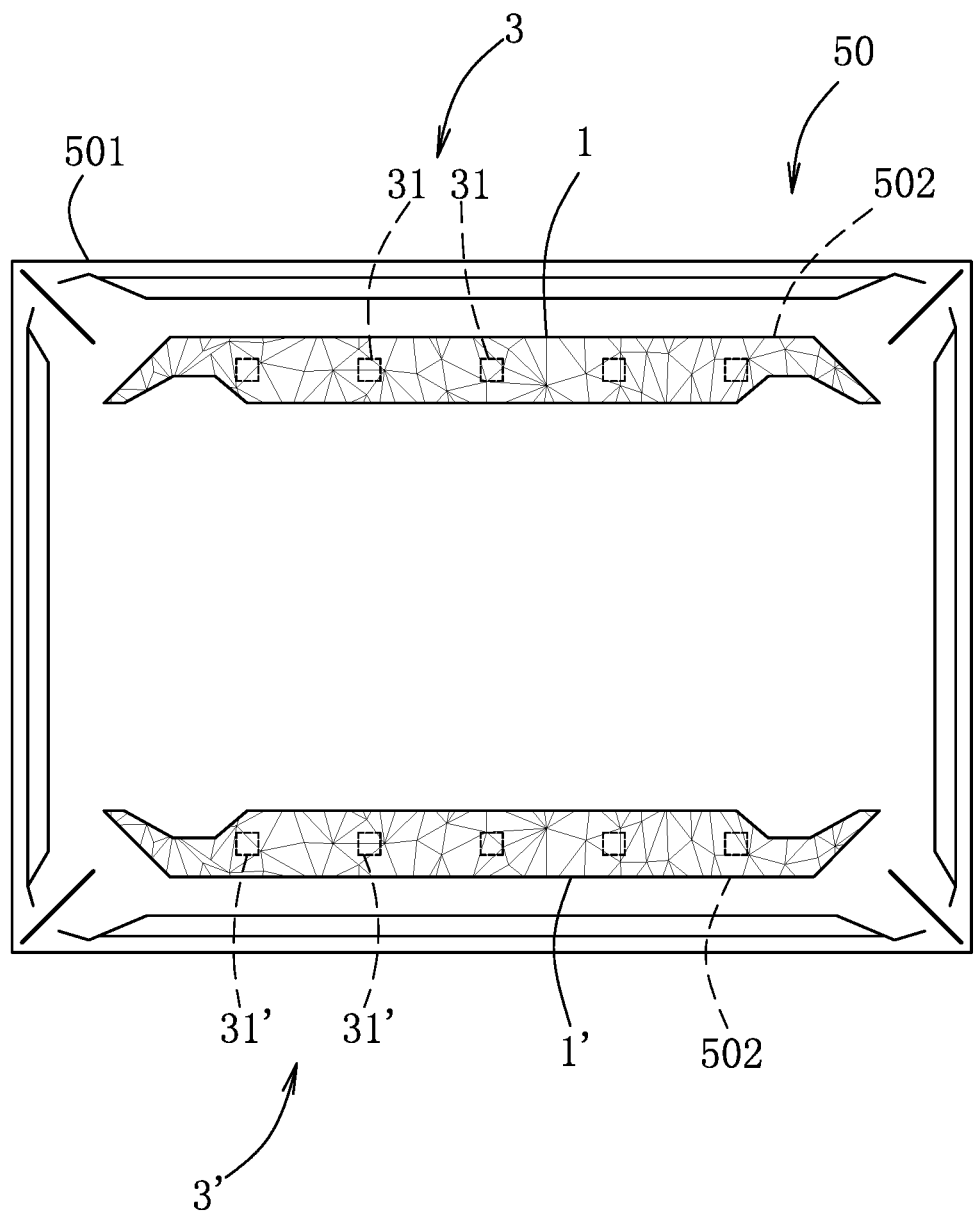
FIG. 17 is a front view of a fifth embodiment of an electronic device according to the disclosure, which is configured as a solid state drive.

Referring to FIG. 17, in a fifth embodiment of the electronic device of the disclosure, the electronic device is configured as a solid state hard drive 50, the main body is configured as a disk shell 501 formed with at least one groove 502, and the first light guide element 1 is disposed on the outer shell 501 and covers the at least one groove 502. In this embodiment, the disk shell 501 is formed with two of the grooves 502 on two opposite sides thereof.

Figure 18:
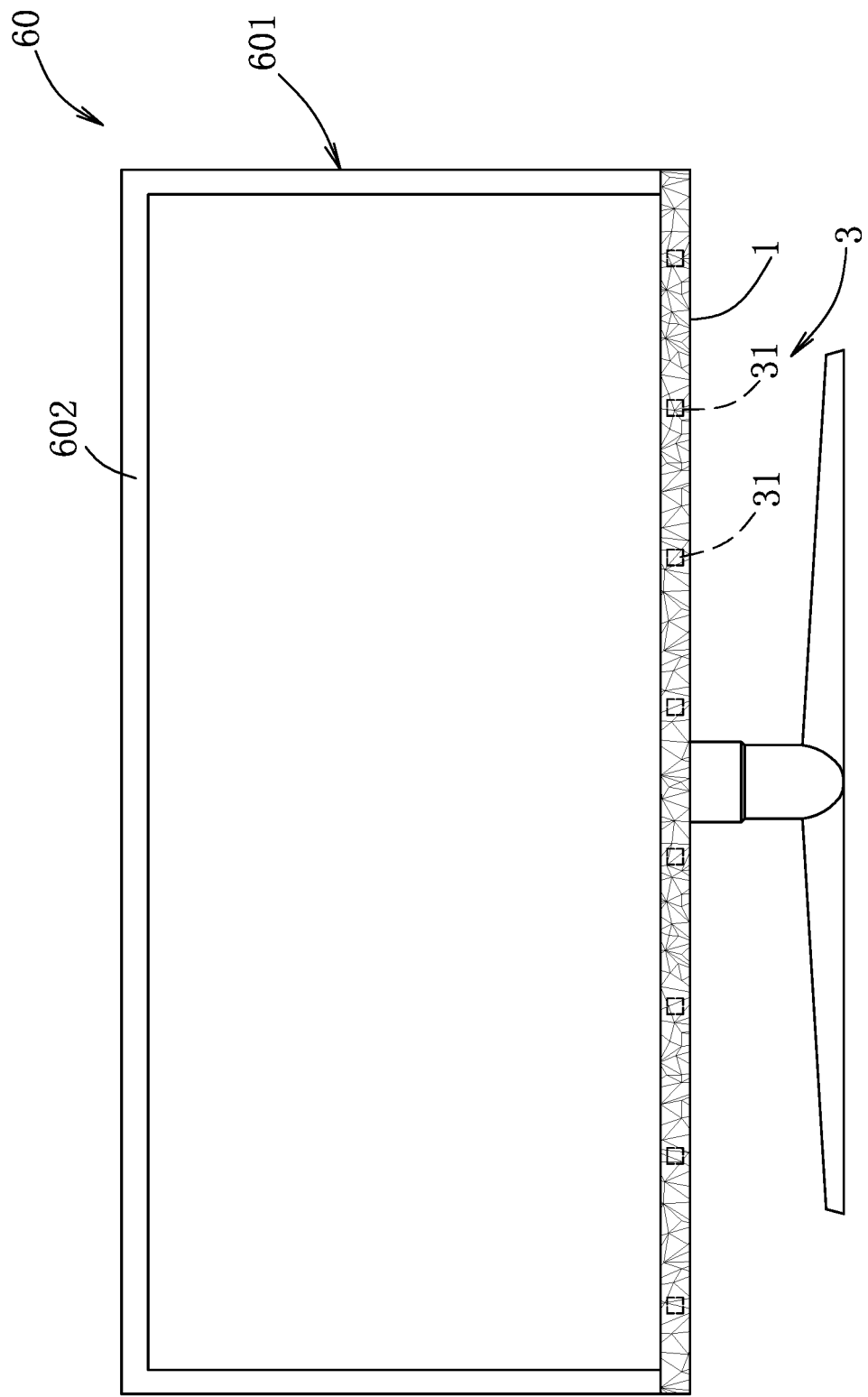
FIG. 18 is a front view of a sixth embodiment of an electronic device according to the disclosure, which is configured as monitor.
Figure 19:
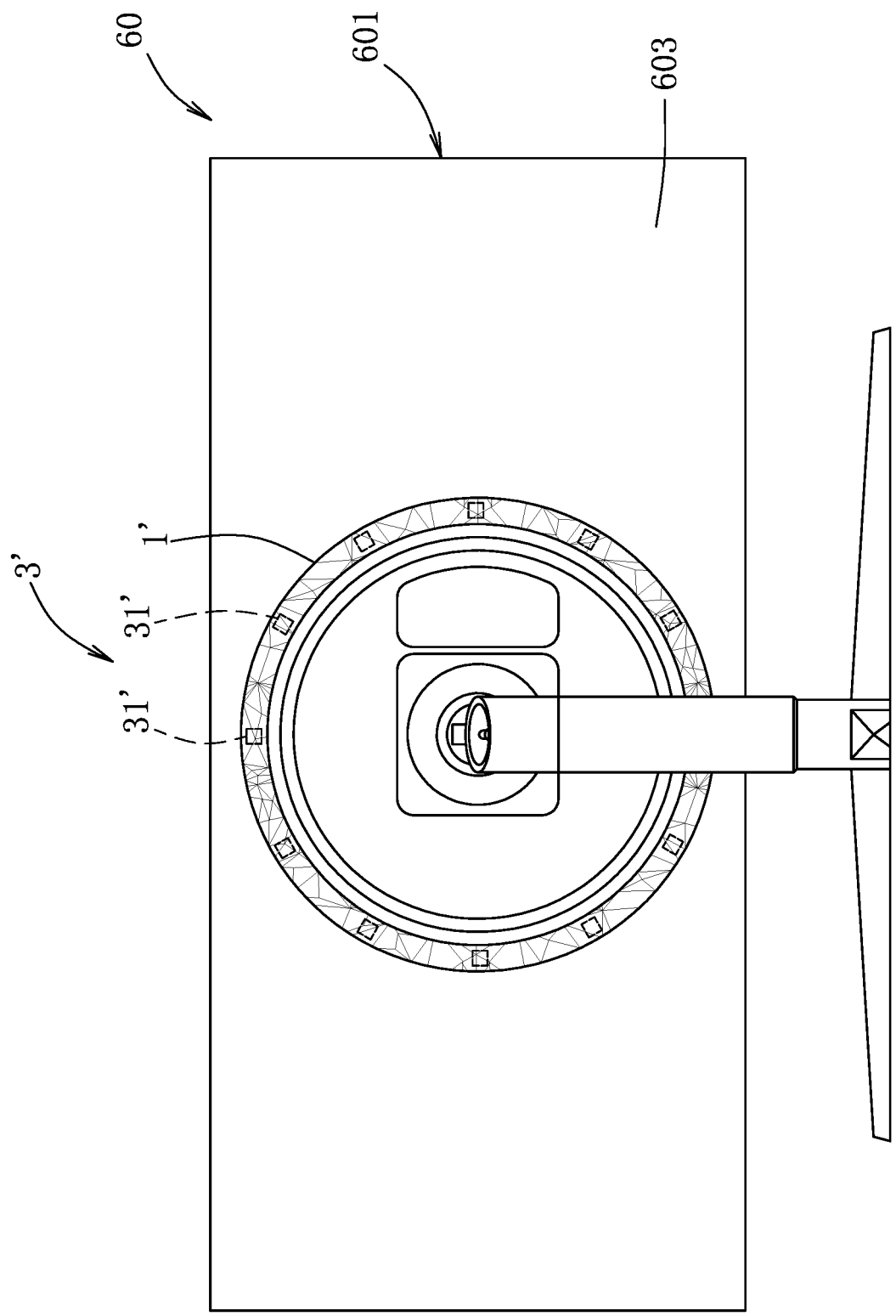
FIG. 19 is a rear view of the electronic device of FIG. 18.

Referring to FIGS. 18 and 19, in a sixth embodiment of the electronic device of the disclosure, the electronic device is configured as a monitor 60, the main body is configured as a monitor shell 601, and the first light guide element 1 is disposed on the monitor shell 601 and covers the at least one light emitting unit 3. The monitor shell 601 includes a front frame 602 and a rear plate 603.

The electronic device includes two of the light emitting units 3, 3' disposed on a lower portion of the front frame 602 and on the rear plate 603, respectively. The light emitting unit 3' disposed on the rear plate 603 is ring-shaped.

The light guide unit further includes a second light guide element 1'. The first light guide element 1 is substantially strip-shaped, disposed on the lower portion of the front frame 602 and covers the light emitting unit 3 which is disposed on the front frame 602. The second light guide element 1' is substantially annular, disposed on the rear plate 603, and covers the light emitting unit 3' which is disposed on the rear plate 603. In variations of this embodiment, one of the first and second light guide elements 1, 1' and the corresponding light emitting unit 3, 3' may be omitted.

Figure 20:
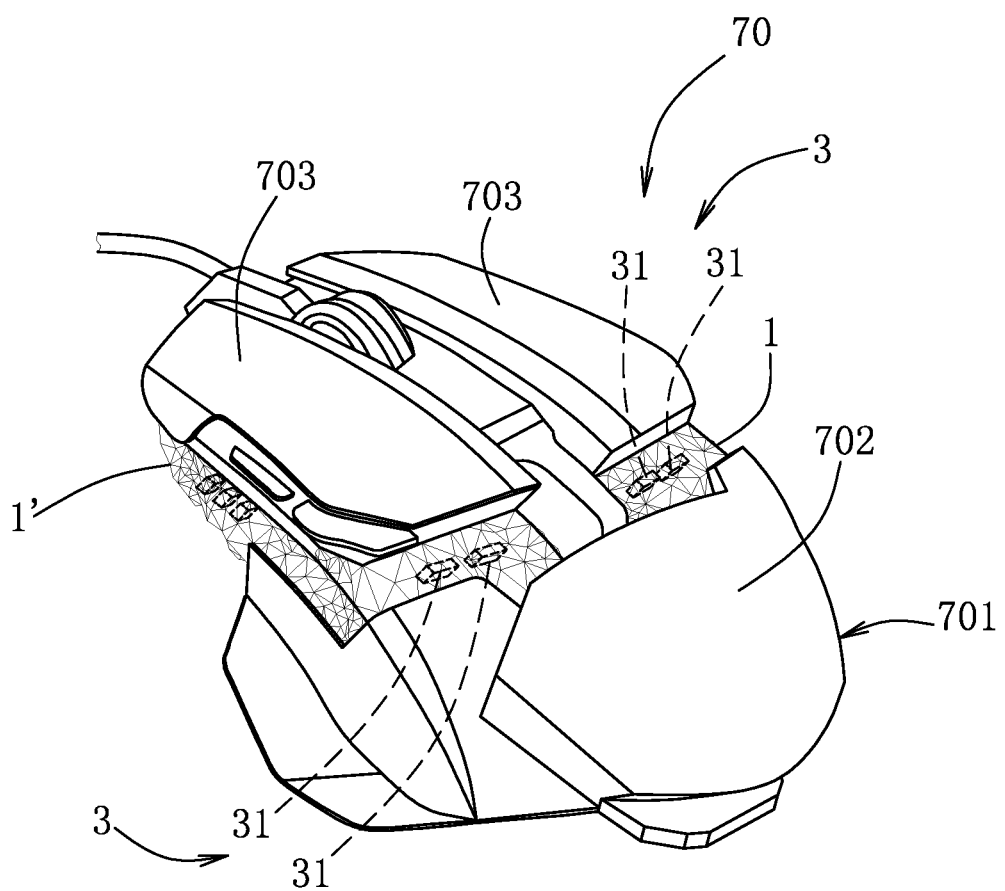
FIG. 20 is a fragmentary perspective view of a seventh embodiment of an electronic device according to the disclosure, which is configured as a mouse.

Referring to FIG. 20, in a seventh embodiment of the disclosure, the electronic device is configured as a mouse 70, and the main body is configured as a mouse body 701, and the electronic device includes a plurality of the light emitting units 3, 3'.

The mouse body 701 has a holding portion 702 and two clicking portions 703 movable relative the holding portion 702. The light emitting units 3, 3' are disposed on the holding portion 702 and proximal to the clicking portions 703. The light guide unit further includes a second light guide element 1'. The first and second light guide elements 1, 1' are substantially L-shaped, are spaced apart from one another, disposed on the holding portion 702 and cover the light emitting units 3, 3'.

Figure 21:
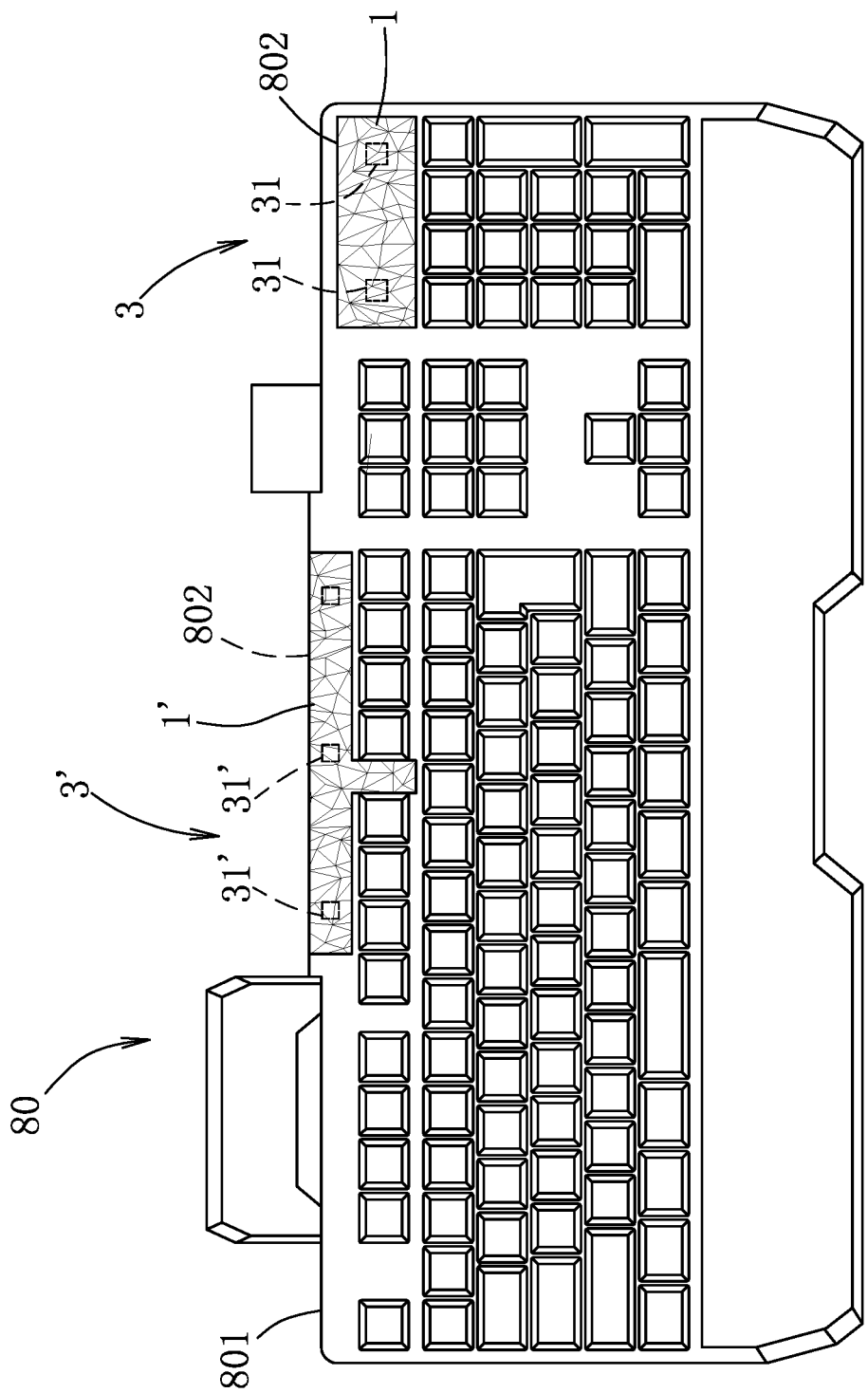
FIG. 21 is a top view of an eighth embodiment of an electronic device according to the disclosure, which is configured as a keyboard.

Referring to FIG. 21, in an eighth embodiment of the electronic device of the disclosure, the electronic device is configured as a keyboard 80, the main body is configured as a keyboard frame 801 formed with two windows 802 respectively disposed on an upper right portion (above the number keys) and a center-upper portion (above the function keys) of the keyboard frame 801, and the electronic device 80 includes a plurality of the light emitting units 3 disposed in the keyboard frame 801 and corresponding in position to the windows 802. The light guide unit further includes a second light guide element 1'. The first and second light guide elements 1, 1' are disposed on the keyboard frame 801 and each covers a respective one of the light emitting units 3 and a respective one of the windows 802. In variations of this embodiment, the number of windows 802 and thus the number of the light guide elements 1 and the light emitting units 3 is not limited to two and can be any number greater than or equal to one.

Figure 22:
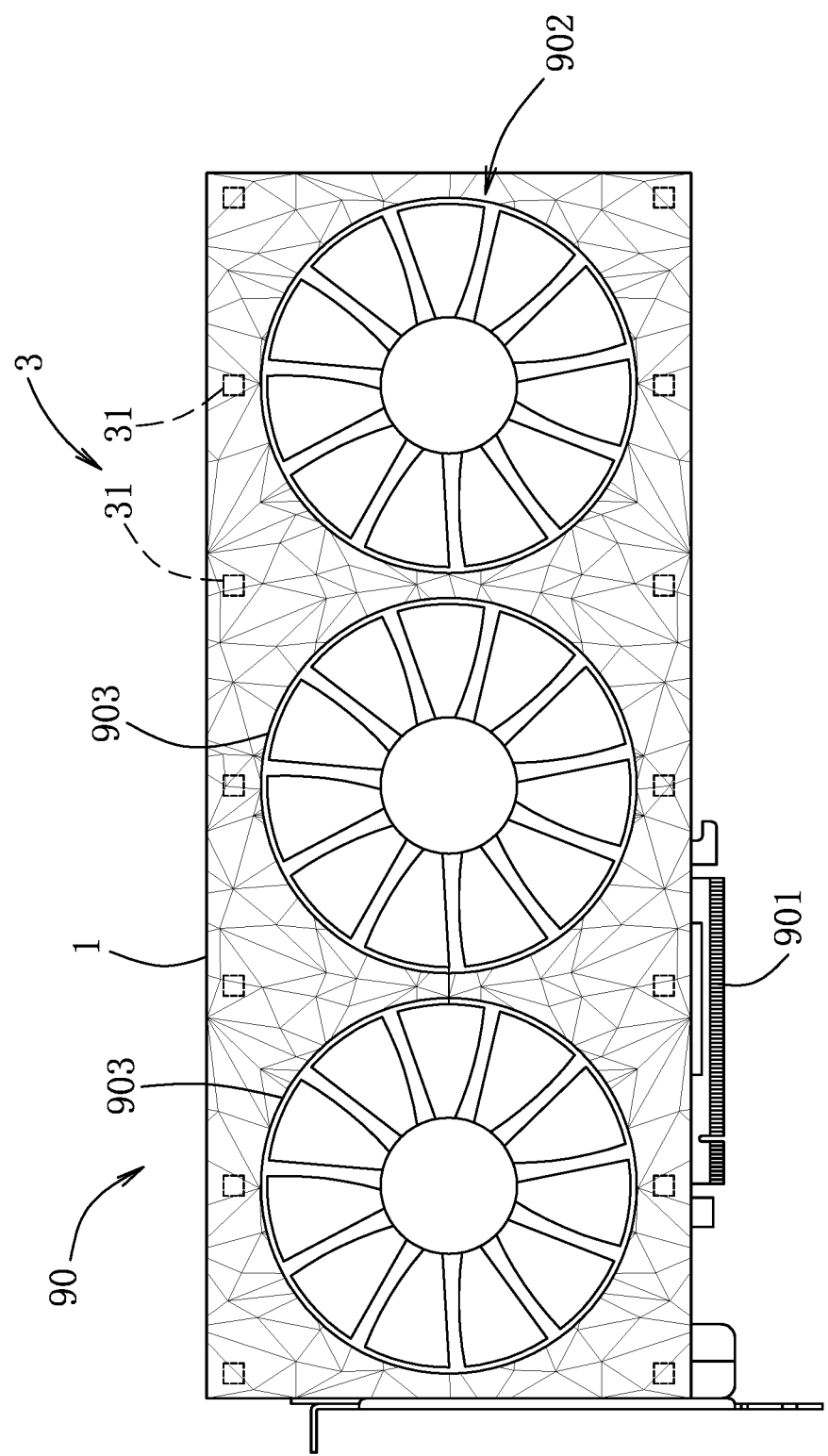
FIG. 22 is a front view of a ninth embodiment of an electronic device of the disclosure, which is configured as a graphics card.

Referring to FIG. 22, in a ninth embodiment of the electronic device of the disclosure, the electronic device is configured as a graphics card 90 and further includes a heat-dissipating module 902. The main body is configured as a card body 901, and the heat-dissipating module 902 is disposed on the card body 901 and includes a plurality of fan blades 903. The at least one light emitting unit 3 includes a plurality of the light emitting elements 31 disposed on the card body 901 surrounding the fan blades 903 of the heat-dissipating module 902. The first light guide element 1 of the light guide unit is disposed on the card body 901, surrounds the fan blades 903 and covers the at least one light emitting elements 31.

Figure 23:
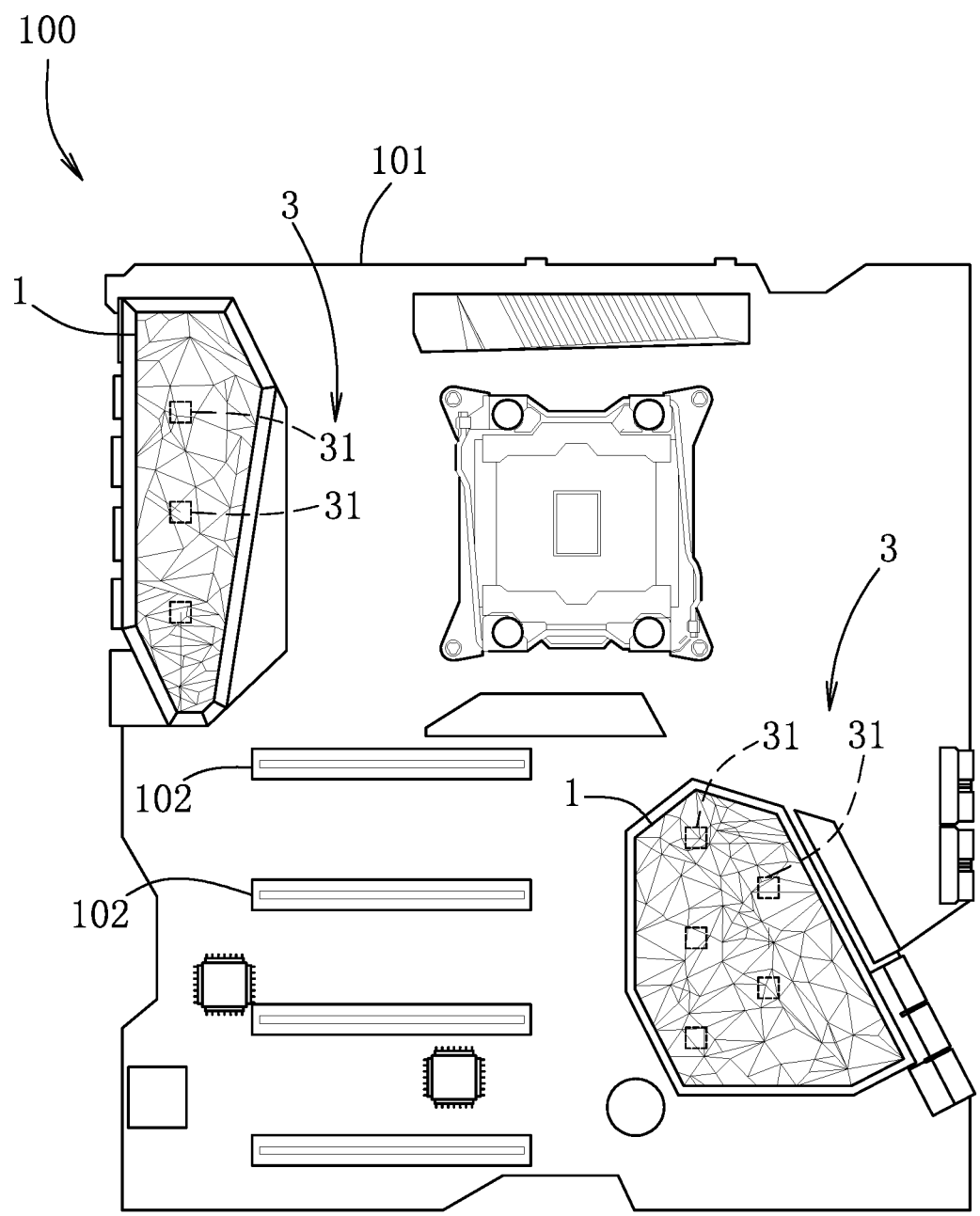
FIG. 23 is a front view of a tenth embodiment of an electronic device of the disclosure, which is configured as a motherboard.

Referring to FIG. 23, in a tenth embodiment of the electronic device of the disclosure, the electronic device is configured as a motherboard 100 and the main body is configured as a board body 101. The first light guide element 1 of the light guide unit is disposed on the board body 101 and covers the at least one light emitting unit 3. In this embodiment, the motherboard 100 includes a plurality of slots 102 disposed on the board body 100, two first light guide elements 1, and two light emitting units 3. The first light guide elements 1 and the corresponding light emitting units 3 are disposed respectively above and to the right of the slots 102, but are not limited to thus in variations of this embodiment.

Figure 24:
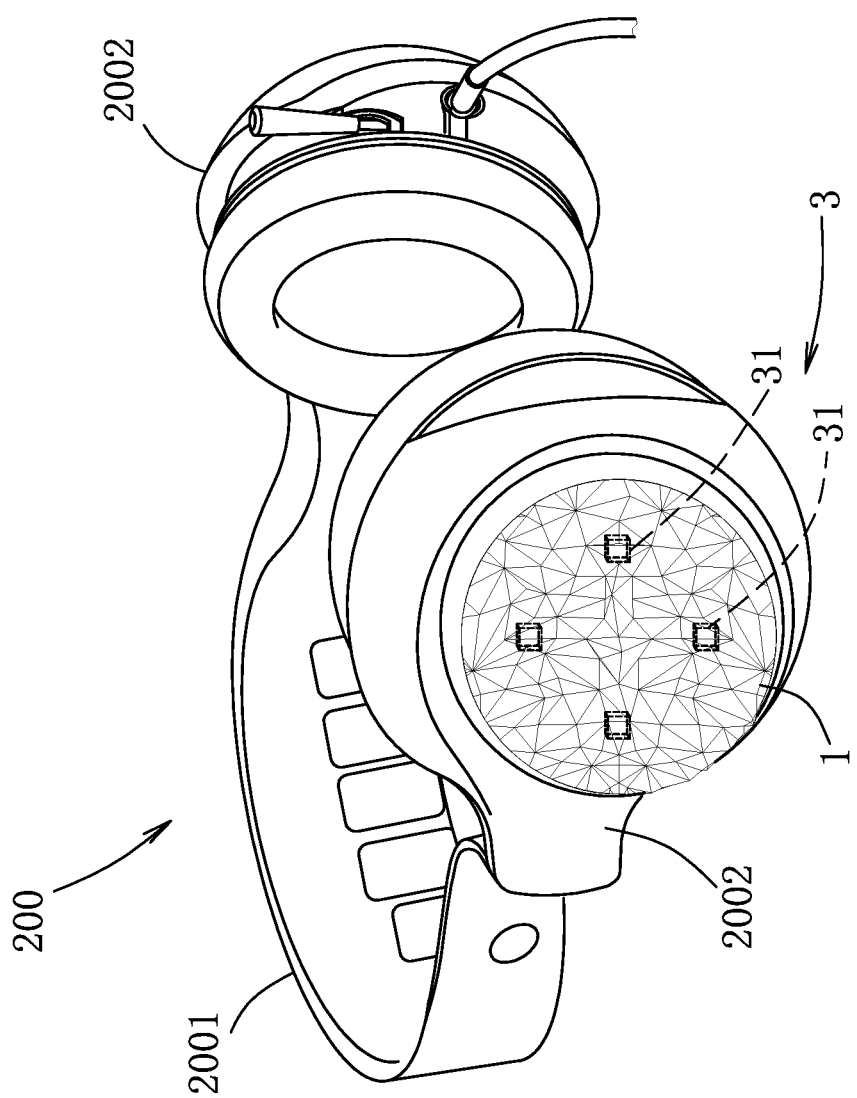
FIG. 24 is a fragmentary perspective view of an eleventh embodiment of an electronic device according to the disclosure, which is configured as a headphone set.

Referring to FIG. 24, in an eleventh embodiment of the electronic device of the disclosure, the electronic device is configured as a headphone set 200, the main body includes a head band 2001 and two headphone units 2002 respectively connected to two opposite ends of the head band 2001, the electronic device includes two of the light emitting units 3 (only one shown), and the light guide unit further includes a second light guide element 1' (not shown). Each of the light emitting units 3 is disposed on an outer surface of a respective one of the headphone units 2002. The first and second light guide elements 1, 1' are disposed on the outer surface of a corresponding one of the headphone units 2002 and cover the light emitting unit 3 disposed on the respective headphone unit 2002.

It should be noted that both the first and second light guide elements 1, 1' have the same primary structure as the aforementioned light guide element 1 shown in FIG. 1 in having the base portion 11 and the light guide bodies 12, but the design and shape may vary depending on different applications.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light guide element adapted to be used in an electronic device including a light emitting unit having at least one light emitting element, comprising:
    a base portion configured to be disposed corresponding in position to a light emitting surface of the light emitting unit, the base portion having:
        a light entry surface for incidence of light emitted by the light emitting unit, and
        at least one side surface connected to said light entry surface; and
    a plurality of light guide bodies disposed on said at least one side surface of said base portion, each of said light guide bodies being formed with at least three light exit surfaces;
    wherein each of said light exit surfaces has an extension direction, said extension direction and said at least one side surface of said base portion forming an angle therebetween, said angle being between 10° and 85°,
        wherein said light guide bodies have a distribution density not less than two of said light guide bodies per sixteen-centimeter square area of said at least one side surface of said base portion,
        wherein said light exit surfaces are at least partially disposed in positional correspondence with the light emitting surface of the light emitting unit,
        wherein said light guide bodies which are disposed on two opposite sides of said at least one side surface of said base portion have a height greater than that of said light guide bodies which are disposed between said two opposite sides of said at least one side surface, and
wherein said light guide bodies disposed between said two opposite sides of said at least one side surface have an uneven height distribution.

2. The light guide element as claimed in claim 1, wherein said angle formed between said at least one side surface of said base portion and said extension direction of each of said light exit surfaces is between 25° and 65°.

3. The light guide element as claimed in claim 1, wherein said light guide bodies together form a continuous irregular shape.

4. A light guide element adapted to be used in an electronic device including a light emitting unit having at least one light emitting element, comprising:
a base portion configured to be disposed corresponding in position to a light emitting surface of the light emitting unit, and including a light entry surface for incidence of light emitted by the light emitting unit and at least one side surface connected to said light entry surface; and
a plurality of light guide bodies disposed on said at least one side surface of said base portion, each of said light guide bodies being formed with at least three light exit surfaces;
wherein each of said light exit surfaces has an extension direction, said extension direction and said at least one side surface of said base portion forming an angle therebetween, said angle being between 10° and 85°,
wherein said light guide bodies have a distribution density not less than two of said light guide bodies per sixteen-centimeter square area of said at least one side surface of said base portion, and
wherein said light guide bodies which are disposed between said two opposite sides of said at least one side surface have an uneven height distribution.

5. An electronic device, comprising:
a main body;
at least one light emitting unit disposed on said main body and having a light emitting surface, said at least one light emitting unit including at least one light emitting element; and
a light guide unit including a first light guide element as claimed in claim 4, said light guide unit being disposed on said main body and in positional correspondence with said light emitting surface of said at least one light emitting unit.

6. The electronic device as claimed in claim 5, wherein said electronic device is configured as a memory module and further includes at least one heat dissipating unit; and
said main body is configured as a memory body, said at least one heat dissipating unit being mounted to said memory body.

7. The electronic device as claimed in claim 6, wherein said first light guide element is disposed on said heat dissipating unit.

8. The electronic device as claimed in claim 6, wherein:
said base portion of said first light guide element includes a first portion and a second portion extending from said first portion along a non-straight line direction, said light entry surface and said at least one side surface extending from said first portion to said second portion;
said first light guide element of said light guide unit further includes a pair of spaced-apart securing members that are respectively formed in said first and second portions of the base portion, each of said securing members connected between said at least one side surface and said light entry surface of said base portion, each of said securing members including:
two opposite end portions, one of which is formed with a hooked portion,
a groove-defining surface extending between said two opposite end portions and defining a receiving groove, and
at least one securing protrusion protruding from said groove-defining surface,
said groove-defining surfaces of said securing members face two different directions; and
said at least one heat dissipating unit includes at least one heat dissipating fin formed with at least one slanting securing groove, said at least one heat dissipating fin being received in a corresponding one of said receiving grooves of said securing members, said at least one securing protrusion of said corresponding securing member being engaged with said at least one slanting securing groove, said hook portions of said securing members being respectively hooked to opposite ends of said at least one heat dissipating unit.

9. The electronic device as claimed in claim 6, wherein each of said light guide bodies of said first light guide element has a height that ranges from 0.5 mm to 5 mm.

10. The electronic device as claimed in claim 5, wherein:
said electronic device is configured as a fan;
said main body is configured as a fan base formed with a recess; and
said first light guide element is fan-blade shaped, rotatably mounted to said fan base and received in said recess so as to cover said at least one light emitting unit.

11. The electronic device as claimed in claim 10, wherein:
said fan base has an outer frame portion and an inner frame portion connected to an inner peripheral of said outer frame portion, said outer and inner frame portions cooperatively define said recess;
said electronic device includes two of said light emitting units, which are annular and are disposed on said inner and outer frame portions, respectively; and
said light guide unit further includes a second light guide component that is ring-shaped and disposed on said outer frame portion, said first light guide element covering one of said light emitting units which is disposed on said inner frame portion, said second light guide element covering the other of said light emitting units which is disposed on said outer frame portion.

12. The electronic device as claimed in claim 5, wherein:
said electronic device is configured as a water cooling module;
said main body is configured as a water cooling head; and
said first light guide element is mounted to said water cooling head and covers said at least one light emitting unit.

13. The electronic device as claimed in claim 5, wherein:
said electronic device is configured as a desktop computer;
said main body is configured as a casing including two side walls, one of which is formed with an opening; and
said first light guide element is disposed on said casing and covers said opening.

14. The electronic device as claimed in claim 5, wherein:
said electronic device is configured as a solid state hard drive;
said main body is configured as a disk shell formed with at least one groove; and said first light guide element is disposed on said outer shell and covers said at least one groove.

15. The electronic device as claimed in claim 5, wherein:
said electronic device is configured as a monitor;
said main body is configured as a monitor shell; and
said first light guide element is disposed on said monitor shell and covers said at least one light emitting unit.

16. The electronic device as claimed in claim 15, wherein:
said monitor shell includes a front frame;
said at least one light emitting unit is disposed on a lower portion of said front frame; and
said first light guide element is substantially strip-shaped and disposed on said lower portion of said front frame and covers said at least one light emitting unit.

17. The electronic as claimed in claim 15, wherein:
said monitor shell includes a rear plate;
said at least one light emitting unit is ring-shaped and disposed on said rear plate; and
said first light guide element is substantially annular and disposed on said rear plate and covers said at least one light emitting unit.

18. The electronic device as claimed in claim 15, wherein:
said monitor shell includes a front frame and a rear plate;
said electronic device includes two of said light emitting units disposed on a lower portion of said front frame and on said rear plate, respectively, said light emitting unit disposed on said rear plate being ring-shaped; and
said light guide unit further includes a second light guide element, said first light guide element being substantially strip-shaped, being disposed on said lower portion of said front frame and covering said light emitting unit which is disposed on said front frame, said second light guide element being substantially annular, being disposed on said rear plate and covering said light emitting unit which is disposed on said rear plate.

19. The electronic device as claimed in claim 5, wherein:
said electronic device is configured as a mouse;
said main body is configured as a mouse body; and
said light guide unit covers said at least one light emitting unit.

20. The electronic device as claimed in claim 19, wherein:
said electronic device includes a plurality of said light emitting units;
said mouse body has a holding portion and two clicking portions movable relative to said holding portion;
said light emitting units are disposed on said holding portion and proximal to said clicking portions; and
said light guide unit further includes a plurality of second light guide elements, said first and second light guide elements being spaced apart one another, being disposed on said holding portion and covering said light emitting units.

21. The electronic device as claimed in claim 5, wherein:
said electronic device is configured as a keyboard;
said main body is configured as a keyboard frame formed with at least one window;
said at least one light emitting unit is disposed in said keyboard frame and corresponds in position to said window; and
said first light guide element is disposed on said keyboard frame and covers said at least one light emitting unit.

22. The electronic device as claimed in claim 21, wherein:
said electronic device includes a plurality of said light emitting units;
said keyboard frame is formed with two windows respectively disposed on a upper right portion and a center-upper portion of said keyboard frame; and
said light guide unit further includes a second light guide element, said first and second light guide elements respectively covering said windows.

23. The electronic device as claimed in claim 5, wherein:
said electronic device is configured as a graphics card and further comprises a heat-dissipating module;
said main body is configured as a card body;
said heat-dissipating module is disposed on said card body and includes a plurality of fan blades;
said at least one light emitting unit includes a plurality of said light emitting elements disposed on said card body surrounding said fan blades of said heat-dissipating module; and
said first light guide element of said light guide unit is disposed on said card body, surrounds said fan blades and covers said at least one light emitting elements.

24. The electronic device as claimed in claim 5, wherein:
said electronic device is configured as a motherboard;
said main body is configured as a board body; and
said first light guide element of said light guide unit is disposed on said board body and covers said at least one light emitting unit.

25. The electronic device as claimed in claim 5, wherein:
said electronic device is configured as a headphone set;
said main body includes a head band and two headphone units respectively connected to two opposite ends of said head band;
said electronic device includes two of said light emitting units, each of said light emitting units being disposed on an outer surface of a respective one of said headphone units; and
said light guide unit further includes a second light guide element, said first and second light guide elements being disposed on said outer surface of a corresponding one of said headphone units and covering said light emitting unit disposed on said respective headphone unit.

26. A light guide element adapted to be used in an electronic device including a light emitting unit having at least one light emitting element, comprising:
a base portion configured to be disposed corresponding in position to a light emitting surface of the light emitting unit, and including a light entry surface for incidence of light emitted by the light emitting unit and at least one side surface connected to said light entry surface; and
a plurality of light guide bodies disposed on said at least one side surface of said base portion, each of said light guide bodies being formed with at least three light exit surfaces;
wherein each of said light exit surfaces has an extension direction, said extension direction and said at least one side surface of said base portion forming an angle therebetween, said angle being between 10° and 85°,
wherein said light guide bodies have a distribution density not less than two of said light guide bodies per sixteen-centimeter square area of said at least one side surface of said base portion, and
wherein said light guide bodies which are disposed on two opposite sides of said at least one side surface of said base portion have a height greater than that of said light guide bodies which are disposed between said two opposite sides of said at least one side surface.

* * * * *